(12) United States Patent
Yamamoto et al.

(10) Patent No.: US 9,781,828 B2
(45) Date of Patent: Oct. 3, 2017

(54) MODULE SUBSTRATE AND METHOD FOR MANUFACTURING MODULE SUBSTRATE

(71) Applicant: Murata Manufacturing Co., Ltd., Nagaokakyo-shi, Kyoto-fu (JP)

(72) Inventors: Issei Yamamoto, Nagaokakyo (JP); Yoshihito Otsubo, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 114 days.

(21) Appl. No.: 13/863,481

(22) Filed: Apr. 16, 2013

(65) Prior Publication Data
US 2013/0223038 A1    Aug. 29, 2013

Related U.S. Application Data

(63) Continuation of application No. PCT/JP2011/073366, filed on Oct. 12, 2011.

(30) Foreign Application Priority Data

Oct. 26, 2010    (JP) .................................. 2010-239535

(51) Int. Cl.
*H05K 1/02*    (2006.01)
*H01L 25/16*    (2006.01)
(Continued)

(52) U.S. Cl.
CPC ..... *H05K 1/0296* (2013.01); *H01L 23/49861* (2013.01); *H01L 23/552* (2013.01);
(Continued)

(58) Field of Classification Search
CPC ........ H05K 1/0296; H05K 3/30; H05K 3/284; H05K 3/0097; H01L 23/49861;
(Continued)

(56) References Cited

U.S. PATENT DOCUMENTS 5,950,070 A * 9/1999 Razon ................. H01L 23/3107
257/E21.518
6,625,036 B1 * 9/2003 Horio .................. H01L 31/0203
257/E31.095

(Continued)

FOREIGN PATENT DOCUMENTS

CN            1658439 A     8/2005
CN          101204125 A     6/2008
(Continued)

OTHER PUBLICATIONS

Official Communication issued in International Patent Application No. PCT/JP2011/073366, mailed on Dec. 20, 2011.

*Primary Examiner* — Tuan T Dinh
*Assistant Examiner* — Rockshana Chowdhury
(74) *Attorney, Agent, or Firm* — Keating & Bennett, LLP

(57) ABSTRACT

A module substrate includes a plurality of electronic components mounted on at least one surface of a base substrate and a columnar terminal connection substrate connected to the one surface of the base substrate on which a plurality of the electronic components are mounted. The terminal connection substrate includes a plurality of conductor portions, at least one corner of the columnar terminal connection substrate is chamfered with a flat surface and/or curved surface, and the terminal connection substrate is connected at a side surface thereof contacting the chamfered surface, to the one surface of the base substrate.

10 Claims, 18 Drawing Sheets

(51) Int. Cl.
   *H05K 3/28* (2006.01)
   *H05K 3/30* (2006.01)
   *H01L 23/00* (2006.01)
   *H01L 23/498* (2006.01)
   *H01L 23/552* (2006.01)
   *H05K 1/14* (2006.01)
   *H05K 3/00* (2006.01)

(52) U.S. Cl.
   CPC ............. *H01L 24/97* (2013.01); *H01L 25/16* (2013.01); *H05K 3/0097* (2013.01); *H05K 3/284* (2013.01); *H05K 3/30* (2013.01); *H01L 23/49811* (2013.01); *H01L 2224/16225* (2013.01); *H01L 2224/97* (2013.01); *H01L 2924/12042* (2013.01); *H01L 2924/15312* (2013.01); *H01L 2924/15322* (2013.01); *H01L 2924/19105* (2013.01); *H01L 2924/19106* (2013.01); *H05K 1/141* (2013.01); *H05K 3/0052* (2013.01); *H05K 2201/1034* (2013.01); *H05K 2201/10477* (2013.01); *H05K 2203/1316* (2013.01); *Y10T 29/4913* (2015.01); *Y10T 29/49146* (2015.01)

(58) Field of Classification Search
   CPC ....... H01L 23/552; H01L 24/97; H01L 25/16; H01L 2924/12042; H01L 23/49811; H01L 2224/16225; Y10T 29/49146; Y10T 29/4913
   USPC .................................................. 361/770–803
   See application file for complete search history.

(56) References Cited

U.S. PATENT DOCUMENTS

| | | | |
|---|---|---|---|
| 6,704,209 | B2 | 3/2004 | Yamauchi et al. |
| 7,258,549 | B2* | 8/2007 | Asahi et al. .................... 439/66 |
| 7,435,621 | B2* | 10/2008 | Yang .................... H01L 23/3114 |
| | | | 257/E21.506 |
| 2002/0021561 | A1* | 2/2002 | Yamauchi .............. H01C 1/012 |
| | | | 361/760 |
| 2005/0168961 | A1* | 8/2005 | Ono et al. ..................... 361/784 |
| 2006/0252178 | A1* | 11/2006 | Yang .................... H01L 21/561 |
| | | | 438/106 |
| 2006/0267159 | A1* | 11/2006 | Yamamoto .......... H01L 23/3121 |
| | | | 257/659 |
| 2008/0139013 | A1 | 6/2008 | Tomura et al. |
| 2009/0140394 | A1* | 6/2009 | Bathan ................. H01L 21/561 |
| | | | 257/621 |
| 2009/0321122 | A1* | 12/2009 | Mori et al. .................... 174/261 |

FOREIGN PATENT DOCUMENTS

| | | |
|---|---|---|
| JP | 2000-208700 A | 7/2000 |
| JP | 2004-303944 A | 10/2004 |
| JP | 2005-158360 A | 6/2005 |
| JP | 2006-019512 A | 1/2006 |
| JP | 2006-173152 A | 6/2006 |
| JP | 2008-294380 A | 12/2008 |

\* cited by examiner

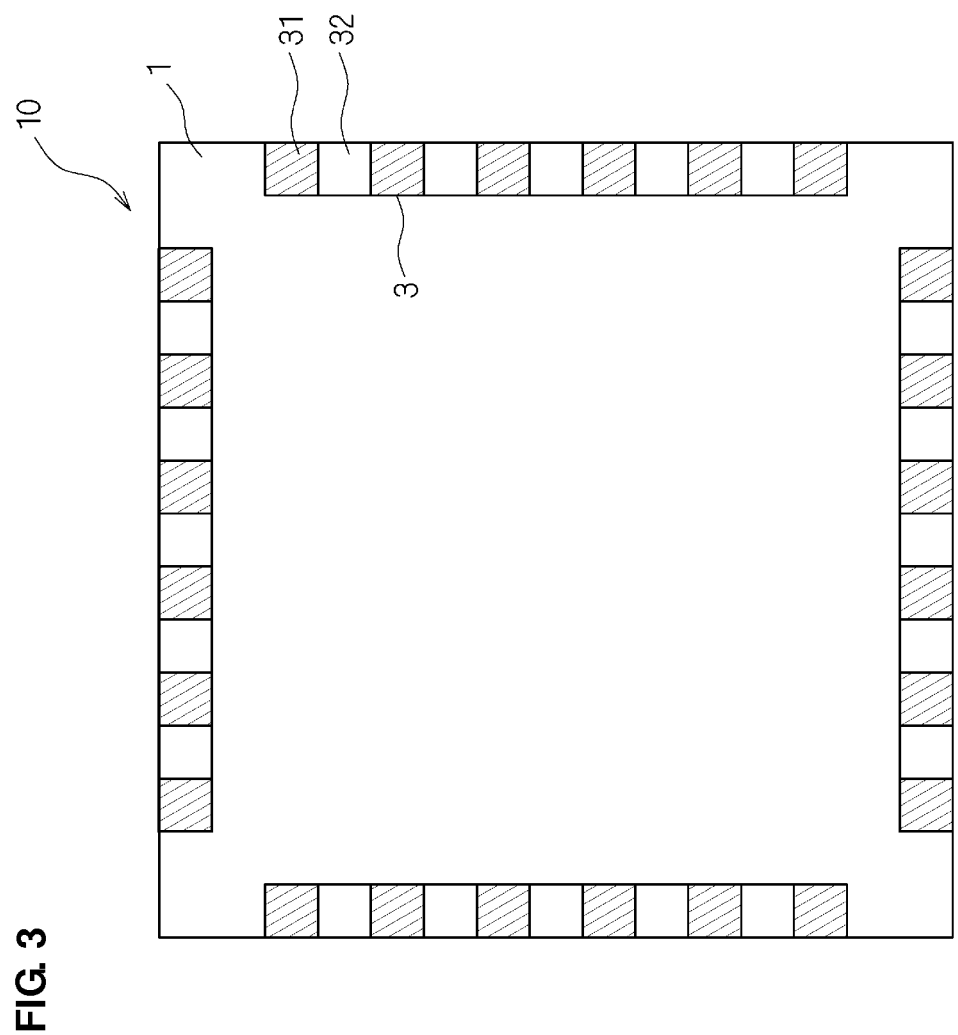

MODULE SUBSTRATE AND METHOD FOR MANUFACTURING MODULE SUBSTRATE

BACKGROUND OF THE INVENTION

1. Field of the Invention

The present invention relates to a module substrate including a terminal connection substrate that is connected to a base substrate including a plurality of electronic components that are mounted on at least one surface thereof, and a method for manufacturing a module substrate.

2. Description of the Related Art

In recent years, with reductions in the size and weight of electronic devices, module substrates mounted in electronic devices have been required to be reduced in size and weight. Thus, a module substrate is reduced in size and weight by mounting electronic components on both surfaces of a base substrate via a lead terminal, a solder ball, a cavity structure, or other suitable structure.

Japanese Unexamined Patent Application Publication No. 2004-303944 discloses a module substrate that includes a main substrate in which a plurality of electronic components are mounted on both surfaces thereof by soldering, and four sub-substrates that have a substantially rectangular parallelepiped shape and are mounted on the outer periphery of the main substrate by soldering. Each sub-substrate includes electrodes having a U shape on a surface of a base material. In addition, in Japanese Unexamined Patent Application Publication No. 2004-303944, a resin is applied to a portion surrounded by the sub-substrates, so as to cover the electronic components. Thus, the module substrate can easily be manufactured without requiring special wiring, and can be automatically mounted on a mother substrate via a machine.

Since each sub-substrate disclosed in Japanese Unexamined Patent Application Publication No. 2004-303944 has a substantially rectangular parallelepiped shape, a cross-sectional area thereof is uniform. Thus, when the cross-sectional area of each sub-substrate is increased in order to securely connect the sub-substrate to the mother substrate, a region in which electronic components can be mounted is relatively small. When the region in which electronic components can be mounted is small, the number of mountable electronic components is reduced, the size of the module substrate itself needs to be increased in order to mount the same number of electronic components, and thus, the size of the module substrate cannot be reduced.

SUMMARY OF THE INVENTION

Preferred embodiments of the present invention provide a module substrate including an increased number of mountable electronic components and having a reduced size even when a required number of electronic components are mounted thereon, and a method for manufacturing a module substrate.

A module substrate according to a preferred embodiment of the present invention includes a plurality of electronic components that are mounted on at least one surface of a base substrate and a plurality of conductor portions connected to the one surface of the base substrate on which a plurality of the electronic components are mounted. At least one corner of each conductor portion is chamfered with a flat surface and/or curved surface, and each conductor portion is connected, at a side surface thereof contacting the chamfered flat surface and/or curved surface, to the one surface of the base substrate.

In the above configuration, since at least the one corner of each conductor portion is chamfered with a flat surface and/or curved surface and each conductor portion is connected, at a side surface thereof contacting the chamfered flat surface and/or curved surface to the one surface of the base substrate, it is possible to mount an electronic component below each conductor portion. Therefore, a region in which electronic components can be mounted is increased in size, and the number of mountable electronic components is increased. In addition, it is possible to reduce the size of the module substrate even when a required number of electronic components are mounted thereon.

In addition, in the module substrate according to a preferred embodiment of the present invention, each conductor portion is preferably arranged such that the chamfered flat surface and/or curved surface faces an inside of the base substrate.

With this configuration, since each conductor portion is arranged such that the chamfered flat surface and/or curved surface faces the inside of the base substrate, it is possible to mount an electronic component below each conductor portion. Therefore, the size of a region in which electronic components can be mounted is increased, and the number of mountable electronic components is also increased. In addition, it is possible to reduce the size of the module substrate even when a required number of electronic components are mounted thereon.

In addition, in the module substrate according to a preferred embodiment of the present invention, a cross-sectional shape of each conductor portion in a plane perpendicular to the base substrate is preferably an inverted L shape, for example.

With this configuration, since the cross-sectional shape of each conductor portion preferably is an inverted L shape, a recess surrounded by each conductor portion and the one surface of the base substrate is provided, and a region in which electronic components can be mounted includes the recess. Therefore, the number of mountable electronic components is increased, and it is possible to reduce the size of the module substrate even when a required number of electronic components are mounted thereon.

In addition, preferably, the module substrate according to a preferred embodiment of the present invention includes a columnar terminal connection substrate including a plurality of the conductor portions and connected to the one surface of the base substrate on which a plurality of the electronic components are mounted, at least one corner of the terminal connection substrate is chamfered with a flat surface and/or curved surface, and the terminal connection substrate is connected, at a side surface thereof contacting the chamfered flat surface and/or curved surface, to the one surface of the base substrate.

With this configuration, since at least the one corner of the terminal connection substrate is chamfered with a flat surface and/or curved surface and the terminal connection substrate is connected, at a side surface thereof contacting the chamfered flat surface and/or curved surface, to the one surface of the base substrate on which a plurality of the electronic components are mounted, it is possible to mount an electronic component below the terminal connection substrate. Therefore, the size of a region in which electronic components can be mounted is increased, and the number of mountable electronic components is increased. In addition, it is possible to reduce the size of the module substrate even when a required number of electronic components are mounted thereon.

In addition, in the module substrate according to a preferred embodiment of the present invention, the terminal connection substrate is preferably arranged such that the chamfered flat surface and/or curved surface faces an inside of the base substrate.

With this configuration, since the terminal connection substrate is arranged such that the chamfered flat surface and/or curved surface faces the inside of the base substrate, it is possible to mount an electronic component below the terminal connection substrate. Therefore, the size of a region in which electronic components can be mounted is increased, and the number of mountable electronic components is increased. In addition, it is possible to reduce the size of the module substrate even when a required number of electronic components are mounted thereon.

In addition, in the module substrate according to a preferred embodiment of the present invention, a cross-sectional shape of the terminal connection substrate is preferably an inverted L shape, for example.

With this configuration, since the cross-sectional shape of the terminal connection substrate is an inverted L shape, a recess surrounded by the terminal connection substrate and the one surface of the base substrate is provided, and a region in which electronic components can be mounted includes the recess. Therefore, the number of mountable electronic components is increased, and it is possible to reduce the size of the module substrate even when a required number of electronic components are mounted thereon.

In addition, in the module substrate according to a preferred embodiment of the present invention, preferably, the terminal connection substrate includes a plurality of insulating portions, and the conductor portions and the insulating portions are alternately stacked in a column.

With this configuration, since the terminal connection substrate includes a plurality of insulating portions and the conductor portions and the insulating portions are alternately stacked in a column, the insulation between the conductor portions is improved. In addition, when the terminal connection substrate is connected to a mounting substrate, since the insulating portions are provided, the size of a region in which the terminal connection substrate is connected to the mounting substrate is increased as compared to a terminal connection substrate in which conductor portions are arranged so as to be spaced apart from each other, and the mounting substrate is securely connected to the terminal connection substrate.

In addition, in the module substrate according to a preferred embodiment of the present invention, an insulating plate is preferably disposed on a side surface of the terminal connection substrate in an outward direction of the base substrate.

With this configuration, since the insulating plate is disposed on the side surface of the terminal connection substrate in the outward direction of the base substrate, the insulating plate protects the side surface of the terminal connection substrate in the outward direction of the base substrate and can prevent oxidation of the conductor portions of the terminal connection substrate. In addition, even when a support portion is made of an insulating material, it is also possible to provide a shield film on the side surface of the terminal connection substrate in the outward direction of the base substrate. Furthermore, when the terminal connection substrate is connected to the one surface of the base substrate, solder can be prevented from flowing out from the side surface of the terminal connection substrate in the outward direction of the base substrate.

In addition, in the module substrate according to a preferred embodiment of the present invention, a plurality of the conductor portions are preferably fixed to each other via the insulating portions and/or the insulating plate in the terminal connection substrate.

With this configuration, since a plurality of the conductor portions are fixed to each other via the insulating portions and/or the insulating plate in the terminal connection substrate, a plurality of the conductor portions can be collectively connected as a single terminal connection substrate to the one surface of the base substrate on which a plurality of the electronic components are mounted, and an operation for manufacturing the module substrate can be simplified.

In addition, in the module substrate according to a preferred embodiment of the present invention, each conductor portion or the terminal connection substrate is preferably arranged such that a position of a side surface thereof in an outward direction of the base substrate coincides or substantially coincides with a position of a side surface of the base substrate.

With this configuration, since each conductor portion or the terminal connection substrate is arranged such that the position of the side surface thereof in the outward direction of the base substrate coincides or substantially coincides with the position of the side surface of the base substrate, the size of a region in which electronic components can be mounted is increased while the size of the module substrate is reduced.

In addition, in the module substrate according to a preferred embodiment of the present invention, a region in which the conductor portions or the terminal connection substrate overlap the electronic component is preferably provided when the one surface of the base substrate is seen in a plan view from a direction perpendicular to the one surface of the base substrate.

With this configuration, since the region in which the conductor portions or the terminal connection substrate overlap the electronic component is provided when the one surface of the base substrate is seen in a plan view from the direction perpendicular to the one surface of the base substrate, the number of mountable electronic components is increased, and it is possible to reduce the size of the module substrate even when a required number of electronic components are mounted thereon.

In addition, preferably, the module substrate according to a preferred embodiment of the present invention includes a resin layer covering the electronic components mounted on the one surface of the base substrate, and a portion of each conductor portion or the terminal connection substrate is exposed from the resin layer.

With this configuration, the resin layer covering the electronic components mounted on the one surface of the base substrate is provided and a portion of each conductor portion or the terminal connection substrate is exposed from the resin layer, the insulation between the electronic components mounted on the one surface of the base substrate is improved. In addition, when electronic components are mounted on both surfaces of the base substrate, since the one surface of the base substrate on which the electronic components and the terminal connection substrate are mounted is covered with the resin layer, it is possible to prevent detachment, movement, or other damage of the electronic components and the terminal connection substrate mounted on the one surface of the base substrate due to stress or other forces generated when electronic components are mounted on the other surface of the base substrate.

In addition, in the module substrate according to a preferred embodiment of the present invention, each conductor portion or the terminal connection substrate is preferably connected to a mounting substrate at a surface thereof opposite to a surface thereof connected to the base substrate.

With this configuration, since each conductor portion or the terminal connection substrate is connected to the mounting substrate at a surface thereof opposite to a surface thereof connected to the base substrate, a space in which an electronic component can be mounted is ensured between the base substrate and the mounting substrate.

A method for manufacturing a module substrate according to another preferred embodiment of the present invention is a method for manufacturing a module substrate in which a collective substrate including a plurality of electronic components mounted on at least one surface thereof is divided into a plurality of module substrates from the collective substrate. The method includes a first step of forming a columnar terminal connection substrate whose cross-sectional shape preferably is a T shape, a second step of connecting the columnar terminal connection substrate to the one surface of the collective substrate such that the columnar terminal connection substrate is located over a cut-out position, and a third step of cutting out a plurality of module substrates at the cut-out position from the collective substrate. In the third step, the columnar terminal connection substrate whose cross-sectional shape is a T shape is divided into two columnar terminal connection substrates whose cross-sectional shape is an inverted L shape.

With this configuration, the columnar terminal connection substrate whose cross-sectional shape is a T shape is formed, the columnar terminal connection substrate is connected to the one surface of the collective substrate such that the columnar terminal connection substrate is located over the cut-out position, and a plurality of the module substrates are cut out at the cut-out position from the collective substrate. When a plurality of the module substrates are cut out from the collective substrate, the columnar terminal connection substrate is divided into the two columnar terminal connection substrates whose cross-sectional shape is an inverted L shape. Thus, a recess surrounded by the terminal connection substrate and the one surface of the base substrate is formed, and a region in which electronic components can be mounted includes the recess. Therefore, the number of mountable electronic components is increased, and it is possible to reduce the size of the module substrate even when a required number of electronic components are mounted thereon.

In addition, in the first step of the method for manufacturing the module substrate according to a preferred embodiment of the present invention, a plurality of conductor portions and a plurality of insulating portions may preferably be alternately stacked in a column to form the terminal connection substrate.

With this configuration, since in the first step, a plurality of conductor portions and a plurality of insulating portions are alternately stacked in a column to form the terminal connection substrate, the insulation between the conductor portions is improved. In addition, when the terminal connection substrate is connected to the mounting substrate, since the insulating portions are provided, the size of a region in which the terminal connection substrate is connected to the mounting substrate is increased as compared to a terminal connection substrate in which conductor portions are arranged so as to be spaced apart from each other, and the mounting substrate can be securely connected to the terminal connection substrate.

A method for manufacturing a module substrate according to another preferred embodiment of the present invention is a method for manufacturing a module substrate in which a collective substrate including a plurality of electronic components mounted on at least one surface thereof is divided into a plurality of module substrates from the collective substrate. The method includes a first step of forming a columnar terminal connection substrate in which two columnar terminal connection substrates whose cross-sectional shape is an inverted L shape are connected to each other via a support portion and whose cross-sectional shape is a T shape, a second step of connecting the columnar terminal connection substrate to the one surface of the collective substrate such that the support portion is located over a cut-out position, and a third step of cutting out a plurality of module substrates at the cut-out position from the collective substrate. In the third step, the support portion is divided into the two columnar terminal connection substrates whose cross-sectional shape is an inverted L shape.

With this configuration, the columnar terminal connection substrate in which the two columnar terminal connection substrates whose cross-sectional shape is an inverted L shape is connected via the support portion and whose cross-sectional shape is a T shape is formed, the columnar terminal connection substrate is connected to the one surface of the collective substrate such that the support portion is located over the cut-out position, and a plurality of the module substrates are cut out at the cut-out position from the collective substrate. When a plurality of the module substrates are cut out from the collective substrate, the support portion is divided into the two columnar terminal connection substrates whose cross-sectional shape is an inverted L shape. Thus, a recess surrounded by the terminal connection substrate and the one surface of the base substrate is formed, and a region in which electronic components can be mounted includes the recess. Therefore, the number of mountable electronic components is increased, and it is possible to reduce the size of the module substrate even when a required number of electronic components are mounted thereon. In addition, the support portion protects the side surface of the terminal connection substrate in the outward direction of the base substrate and can prevent oxidation of conductor portions of the terminal connection substrate. Furthermore, even when the support portion is formed from an insulating material, it is possible to provide a shield film on the side surface of the terminal connection substrate in the outward direction of the base substrate.

In addition, in the third step of the method for manufacturing the module substrate according to a preferred embodiment of the present invention, the support portion may preferably be removed.

With this configuration, since the support portion is completely removed when a plurality of the module substrates are cut out from the collective substrate, it is possible to reduce the size of the module substrate by removing the support portion.

In addition, the method for manufacturing the module substrate according to a preferred embodiment of the present invention includes a fourth step of forming a resin layer covering the electronic components mounted on at least the one surface of the collective substrate before cutting out a plurality of the module substrates from the collective substrate, and the fourth step forms the resin layer such that a portion of the terminal connection substrate is exposed therefrom.

With this configuration, before cutting out a plurality of the module substrates from the collective substrate, the resin layer covering the electronic components mounted on at least the one surface of the collective substrate is formed such that the portion of the terminal connection substrate is exposed therefrom. Thus, the insulation between the electronic components mounted on the one surface of the collective substrate is improved. In addition, since the one surface of the base substrate on which the electronic components and the terminal connection substrate are mounted is previously covered with the resin layer when electronic components are mounted on both surfaces of the collective substrate, it is possible to prevent detachment, movement, or other damage of the electronic components and the terminal connection substrate mounted on the one surface of the base substrate due to stress or the forces generated when electronic components are mounted on the other surface of the base substrate.

According to various preferred embodiments of the present invention, at least the corner of each conductor portion or the columnar terminal connection substrate is chamfered with a flat surface and/or curved surface, and each conductor portion or the columnar terminal connection substrate is connected, at a side surface thereof contacting the chamfered flat surface and/or curved surface, to the one surface of the base substrate. Thus, it is possible to mount an electronic component below each conductor portion or the terminal connection substrate. Therefore, the size of a region in which electronic components can be mounted is increased, and the number of mountable electronic components is increased. In addition, it is possible to reduce the size of the module substrate even when a required number of electronic components are mounted thereon.

In addition, according to various preferred embodiments of the present invention, the columnar terminal connection substrate whose cross-sectional shape is a T shape is formed, the columnar terminal connection substrate is connected to the one surface of the collective substrate such that the columnar terminal connection substrate is located over the cut-out position, and a plurality of the module substrates are cut out at the cut-out position from the collective substrate. When a plurality of the module substrates are cut out from the collective substrate, the columnar terminal connection substrate whose cross-sectional shape is a T shape is divided into the two columnar terminal connection substrates whose cross-sectional shape is an inverted L shape. Thus, a recess surrounded by the terminal connection substrate and the one surface of the base substrate is formed, and a region in which electronic components can be mounted includes the recess. Therefore, the number of mountable electronic components is increased, and it is possible to reduce the size of the module substrate even when a required number of electronic components are mounted thereon.

Furthermore, according to various preferred embodiments of the present invention, the columnar terminal connection substrate in which the two columnar terminal connection substrates whose cross-sectional shape is an inverted L shape are connected to each other via the support portion and whose cross-sectional shape is a T shape is formed, the columnar terminal connection substrate is connected to the one surface of the collective substrate such that the support portion is located over the cut-out position, and a plurality of the module substrates are cut out at the cut-out position from the collective substrate. When a plurality of the module substrates are cut out from the collective substrate, the support portion is divided into the two columnar terminal connection substrates whose cross-sectional shape is an inverted L shape. Thus, a recess surrounded by the terminal connection substrate and the one surface of the base substrate is formed, and a region in which electronic components can be mounted includes the recess. Therefore, the number of mountable electronic components is increased, and it is possible to reduce the size of the module substrate even when a required number of electronic components are mounted thereon. In addition, the support portion protects the side surface of the terminal connection substrate in the outward direction of the base substrate and can prevent oxidation of the conductor portions of the terminal connection substrate. Furthermore, even when the support portion is made of an insulating material, it is also possible to provide a shield film on the side surface of the terminal connection substrate in the outward direction of the base substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a plan view of the module substrate showing an arrangement of terminal connection substrates according to the first preferred embodiment of the present invention.

DETAILED DESCRIPTION OF THE PREFERRED EMBODIMENTS

Hereinafter, preferred embodiments of the present invention will be described in detail with reference to the drawings.

First Preferred Embodiment

Figure 1:
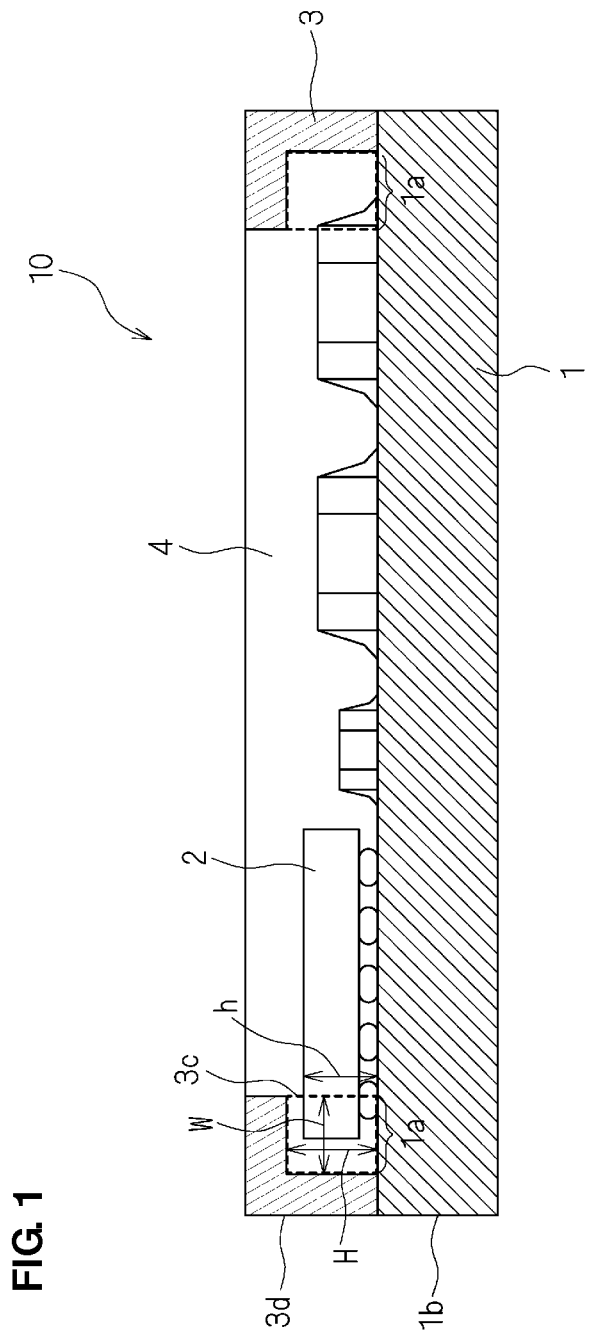
FIG. 1 is a schematic diagram showing a configuration of a module substrate according to a first preferred embodiment of the present invention.

FIG. 1 is a schematic diagram showing a configuration of a module substrate according to the first preferred embodiment of the present invention. As shown in FIG. 1, the module substrate 10 includes a base substrate 1, a plurality of electronic components 2 mounted on one surface of the base substrate 1, terminal connection substrates 3 connected to the one surface of the base substrate 1 on which a plurality of the electronic components 2 are mounted, and a resin layer 4 covering the electronic components 2 mounted on the one surface of the base substrate 1.

The base substrate 1 is preferably an LTCC (low temperature co-fired ceramics) substrate, an organic substrate, or other suitable substrate, for example, but is not particularly limited thereto. Surface electrodes (not shown) are provided on the surface of the base substrate 1 on which the electronic components 2 are mounted. The electronic components 2 are surface-mount type electronic components (surface mount device) which can be surface-mounted on the one surface of the base substrate 1.

Each terminal connection substrate 3 is preferably a columnar substrate in which at least one corner thereof is chamfered with a flat surface and/or curved surface. For example, in the first preferred embodiment, each terminal connection substrate 3 is a columnar substrate whose cross-sectional shape is preferably an inverted L shape, for example, and includes a plurality of conductor portions electrically connected to the one surface of the base substrate 1 on which a plurality of the electronic components 2 are mounted. In the first preferred embodiment, a portion of a height H and a width W in a cross-sectional surface of the terminal connection substrate 3 is chamfered. The terminal connection substrate 3 is arranged such that the chamfered portion faces the inside of the base substrate 1. In other words, in the first preferred embodiment, each terminal connection substrate 3 is connected to the one surface of the base substrate 1, on which a plurality of the electronic components 2 are mounted, such that the cross-sectional shape thereof is an inverted L shape, and is connected such that an opening (a portion encircled by a dotted line) of a recess 3c surrounded by the terminal connection substrate 3 and the one surface of the base substrate 1 faces the inside of the base substrate 1. Therefore, because of the recess 3c, the size of a region in which the electronic components 2 can be mounted is increased a region 1a. In other words, the number of mountable electronic components 2 is increased, and the size of the module substrate 10 can be reduced even when a required number of electronic components are mounted thereon. In addition, a mounting substrate (mother substrate) which is not shown is connected to the terminal connection substrates 3, and a region in which the mounting substrate is connected to the terminal connection substrate 3 needs to have a predetermined surface area for secure connection. When a terminal connection substrate having a rectangular column shape or a circular column shape is used, as in the related art, if a region in which the mounting substrate is connected to the terminal connection substrate 3 is set to have a predetermined surface area, a region in which the base substrate 1 is connected to the terminal connection substrate 3 also has the predetermined surface area, and thus, the size of a region in which the electronic components 2 can be mounted is reduced. In contrast, in the first preferred embodiment, even when a region in which the mounting substrate is connected to the terminal connection substrate 3 is set to have a predetermined surface area, a region in which the base substrate 1 is connected to the terminal connection substrate 3 can be set to have a surface area less than the predetermined surface area, and the size of a region in which the electronic components 2 can be mounted is increased. It is noted that the mounting substrate is an electronic circuit substrate for mounting a plurality of module substrates 10, electronic components 2, and other suitable components thereon and electrically connecting each of them.

The resin layer 4 is an insulating material preferably composed of an epoxy resin or other suitable resin, for example. Thus, the insulation between the electronic components 2 mounted on the one surface of the base substrate 1 is improved. In addition, when electronic components 2 are mounted on both surfaces of the base substrate 1, when the one surface of the base substrate 1 on which the electronic components 2 and the terminal connection substrates 3 are mounted is previously covered with the resin layer 4, it is possible to prevent detachment, movement, or other damage of the electronic components 2 and the terminal connection substrates 3 mounted on the one surface of the base substrate 1 due to stress or other forces generated when electronic components are mounted on the other surface of the base substrate 1. It is noted that when it is not necessary to take into account the insulation between the electronic components 2 mounted on the one surface of the base substrate 1, the resin layer 4 may be omitted.

Figure 2:
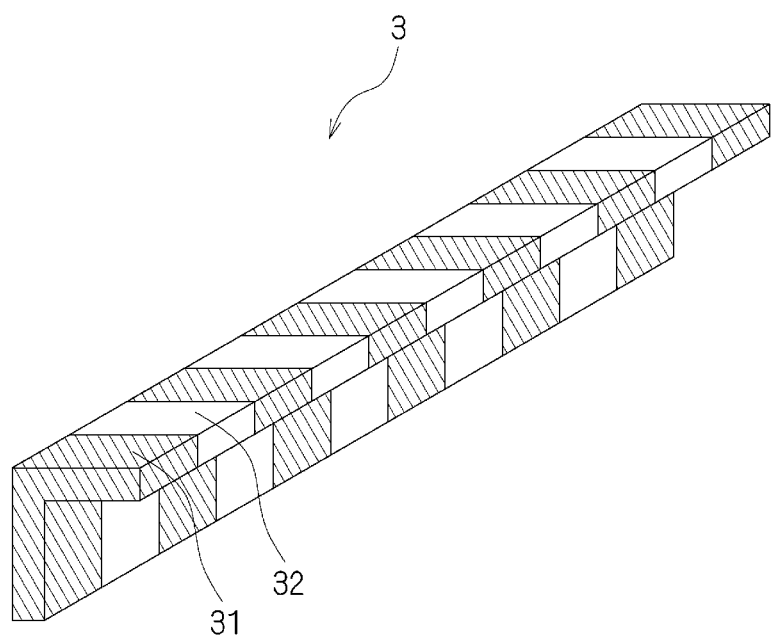
FIG. 2 is a perspective view showing a configuration of a terminal connection substrate according to the first preferred embodiment of the present invention.

FIG. 2 is a perspective view showing a configuration of the terminal connection substrate 3 according to the first preferred embodiment of the present invention. As shown in FIG. 2, the terminal connection substrate 3 is formed preferably by alternately stacking conductor portions 31 and insulating portions 32 in a column. Since each insulating portion 32 is provided between the conductor portions 31, the insulation between the conductor portions 31 is improved. In addition, when the mounting substrate is connected to the terminal connection substrate 3, since the insulating portions 32 are provided, the size of a region in which the terminal connection substrate 3 is connected to the mounting substrate is increased as compared to a terminal connection substrate in which conductor portions are arranged so as to be spaced apart from each other, and the mounting substrate is securely connected to the terminal connection substrate 3. In addition, since a plurality of the conductor portions 31 are fixed to each other via the insulating portions 32 in each terminal connection substrate 3, a plurality of the conductor portions 31 can be collectively connected as a single terminal connection substrate 3 to the one surface of the base substrate 1 on which a plurality of the electronic components 2 are mounted, and an operation for manufacturing the module substrate 10 is simplified.

It is noted that the conductor portions 31 of the terminal connection substrate 3 are preferably made of a conductive material composed of copper or other suitable material, for example, and the insulating portions 32 of the terminal connection substrate 3 are preferably made of an insulating material composed of a ceramic, glass, an epoxy resin, or other suitable material, for example. As shown in FIG. 1, the height H of the recess $3c$ surrounded by the terminal connection substrate 3 and the one surface of the base substrate 1 when the terminal connection substrate 3 is connected to the one surface of the base substrate 1 on which a plurality of the electronic components 2 are mounted is preferably greater than the height h of each electronic component 2 mounted on the one surface of the base substrate 1.

FIG. 3 is a plan view of the module substrate 10 showing an arrangement of the terminal connection substrates 3 according to the first preferred embodiment of the present invention. As shown in FIG. 3, the terminal connection substrates 3 preferably are connected to four outer sides, respectively, of the rectangular base substrate 1. When each terminal connection substrate 3 is arranged such that the position of a side surface $3d$ thereof in an outward direction of the base substrate 1 coincides or substantially coincides with the position of a side surface $1b$ of the base substrate 1 as shown in FIG. 1, the size of a region in which the electronic components 2 can be mounted is increased while the size of the module substrate 10 is reduced.

It is noted that the terminal connection substrates 3 connected to the respective outer sides of the base substrate 1 may be separate terminal connection substrates, or terminal connection substrates connected to two sides, three sides, or four sides may be integrated with each other. In addition, the terminal connection substrate 3 may be formed by alternately stacking the conductor portions 31 and the insulating portions 32 in a column on the one surface of the base substrate 1 on which a plurality of the electronic components 2 are mounted, or the terminal connection substrate 3 in which a plurality of the conductor portions 31 and a plurality of the insulating portions 32 are alternately stacked in a column as shown in FIG. 2 may be previously formed and then the terminal connection substrate 3 may be connected to the one surface of the base substrate 1 on which a plurality of the electronic components 2 are mounted. Furthermore, the terminal connection substrate 3 may include only a plurality of the conductor portions 31 in a comb shape without providing the insulating portions 32.

Figure 4A:
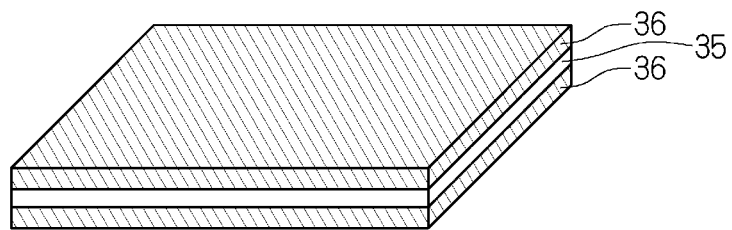
FIGS. 4A to 4E are perspective views showing a process for manufacturing the terminal connection substrate according to the first preferred embodiment of the present invention.

FIGS. 4A to 4E are perspective views showing a process for manufacturing the terminal connection substrate 3 according to the first preferred embodiment of the present invention. First, as shown in FIG. 4A, copper foils 36 having a predetermined thickness are attached to both surfaces of an insulating substrate 35 made of a ceramic, glass, an epoxy resin, or other suitable material, for example. In the first preferred embodiment, each of the thicknesses of the copper foils 36 is preferably about 300 μm, for example. It is noted that the insulating substrate 35 may be a substrate having high rigidity or a substrate having flexibility. In addition, each copper foil 36 is not limited to pure copper, but may be a copper alloy, such as phosphor bronze and brass. The copper alloy has higher processability than pure copper, and thus burrs, elongations, and other defects are unlikely to occur during division with a dicer, top surface grinding, or other processing steps.

Furthermore, the copper foils 36 may be formed by plating. For example, it is sufficient to attach copper foils having a thickness of about 150 μm, for example, to both surfaces of the insulating substrate 35 and plating is conducted thereon to provide a thickness of about 200 μm to about 400 μm, for example, to each copper foil. The thicknesses of the copper foils 36 are preferably about 100 μm to about 500 μm, and more preferably about 200 μm to about 400 μm, for example.

Figure 4B:
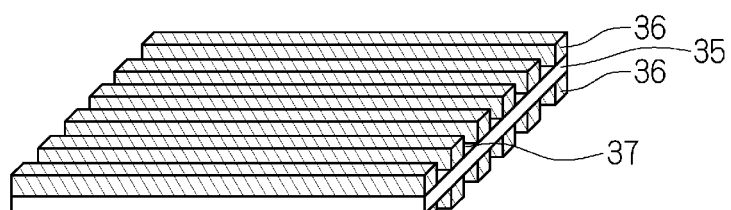

Next, as shown in FIG. 4B, comb-shaped grooves 37 are formed at the same positions on each of the copper foils 36 attached to both surfaces. The method for forming the grooves 37 is not particularly limited, but may be any suitable method, such as etching, cutting with a dicer, and a combination thereof, for example, as long as the copper foils 36 can be reliably removed to form the grooves 37.

Figure 4C:
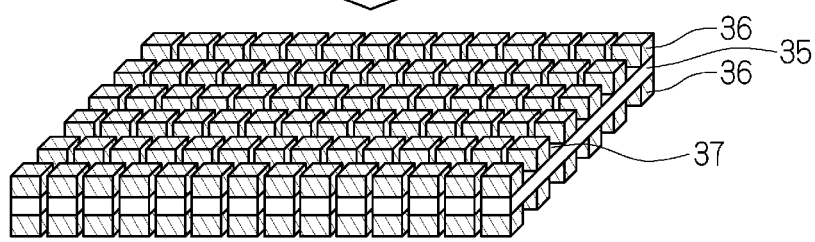
Figure 4D:
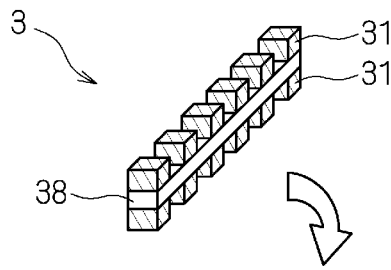
Figure 4E:
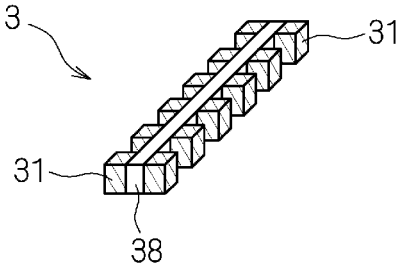

As shown in FIG. 4C, by using a dicer, the insulating substrate 35 and the copper foils 36 are divided in a direction intersecting the grooves 37, to cut out a terminal connection substrate 3 having conductor portions 31 on both surfaces of an insulating material (support portion) 38 as shown in FIG. 4D. A width for division with the dicer is preferably the height of the terminal connection substrate 3 when being connected to the one surface of the base substrate 1 on which a plurality of the electronic components 2 are mounted. Therefore, the width for division and cutting out with the dicer must be greater than the height of each electronic component 2 to be mounted, preferably by at least about 100 μm, for example. This is because when the heights of the electronic components 2 to be mounted are varied and, thus, the height of the electronic component 2 is greater than the height of the terminal connection substrate 3 when being connected to the base substrate 1, connection failure to the mounting substrate may occur. The conductor portions 31 of the cut-out terminal connection substrate 3 are subjected to plating treatment or anticorrosive treatment, and the terminal connection substrate 3 is rotated about 90 degrees such that the conductor portions 31 are located on both side surfaces of the insulating material 38 as shown in FIG. 4E. It is noted that a plating film is formed by wet plating or other suitable method, for example, of Ni/Sn, Ni/Au, Ni/Pd/Au, or other suitable material, for example. In addition, when the anticorrosive treatment is conducted, oxidation of copper forming the conductor portions 31 can be reduced or prevented, and solder wettability at the connection to the base substrate 1 can be improved.

Furthermore, division is performed with the dicer at the groove 37 at a desired position among the grooves 37, such that a terminal connection substrate 3 provided with a desired number of conductor portions 31 can be manufactured.

Figure 5:
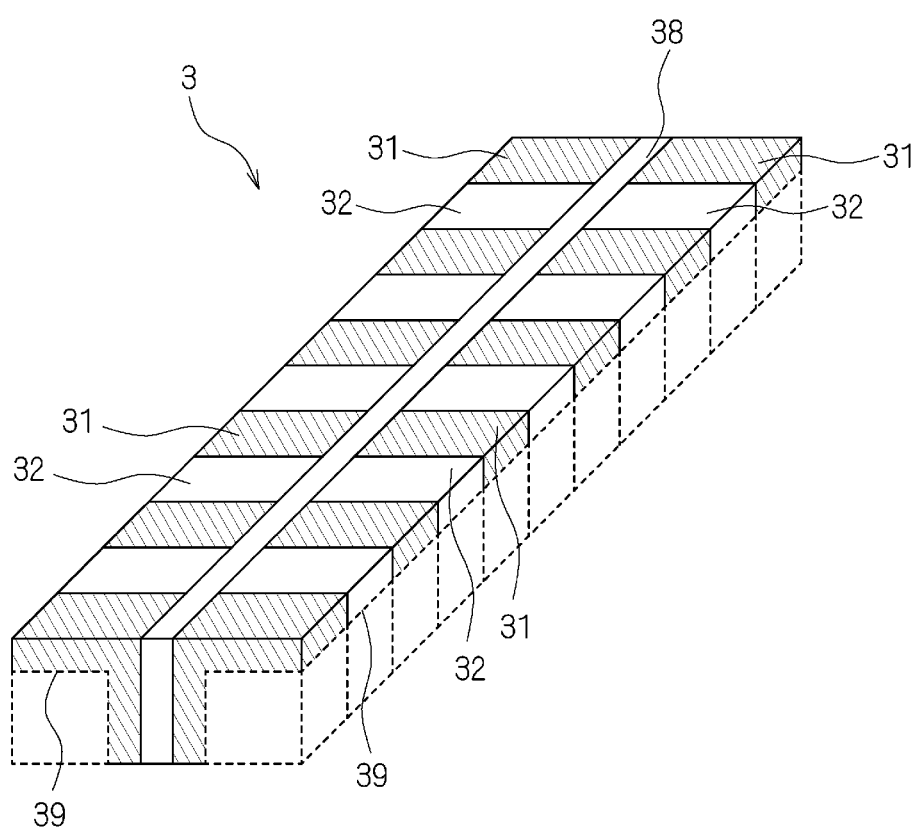
FIG. 5 is a perspective view showing a configuration of the terminal connection substrate having insulating portions according to the first preferred embodiment of the present invention.

Next, a resist is printed between the conductor portions 31 to form insulating portions 32. FIG. 5 is a perspective view showing a configuration of the terminal connection substrate 3 including the insulating portions 32 according to the first preferred embodiment of the present invention. As shown in FIG. 5, the insulating portions 32 fill the gaps between the conductor portions 31 located on both side surfaces of the insulating material 38. Furthermore, portions of broken lines 39 are chamfered such that a columnar terminal connection substrate 3 can be provided in which the conductor portions 31 and the insulating portions 32 are alternately stacked in a column on both side surfaces of the insulating material 38 and whose cross-sectional shape is a T shape. In other words, a columnar terminal connection substrate 3 can be provided in which two columnar terminal connection substrates 3 whose cross-sectional shape is an inverted L shape as shown in FIG. 2 are connected to each other via the insulating material 38 and whose cross-sectional shape is a T shape.

It is noted that when a copper foil having a relatively small thickness (thickness in a direction in which the terminal connection substrates 3 sandwich the insulating material 38) is preferably used instead of the insulating material 38, the two columnar terminal connection substrates 3 whose cross-sectional shape is an inverted L shape are connected to each other via the copper foil so as be integrated with each other, such that the columnar terminal connection substrate 3 whose cross-sectional shape is a T shape is provided. Hereinafter, with regard to a process for manufacturing the module substrate 10 according to the first preferred embodiment of the present invention, a method for manufacturing the module substrate 10 by using the columnar terminal connection substrate 3 in which the two columnar terminal connection substrates 3 whose cross-sectional shape is an inverted L shape are integrated with each other and whose cross-sectional shape is a T shape will be described.

Figure 6A:
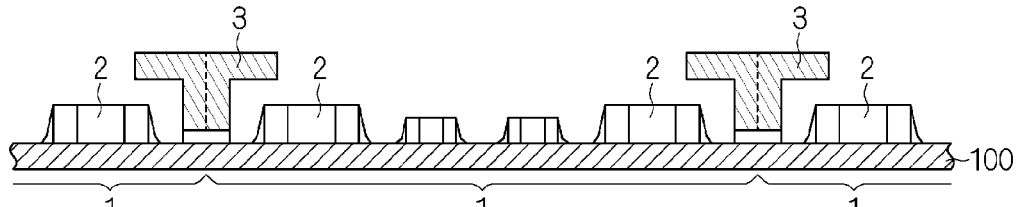
FIGS. 6A to 6F are schematic diagrams showing a process for manufacturing the module substrate according to the first preferred embodiment of the present invention.

FIGS. 6A to 6F are schematic diagrams showing a process for manufacturing the module substrate 10 according to the first preferred embodiment of the present invention. First, as shown in FIG. 6A, on one surface of a collective substrate 100, electronic components 2 are mounted onto surface electrodes (not shown) on which solder is printed, and columnar terminal connection substrates 3 in which two columnar terminal connection substrates 3 whose cross-sectional shape is an inverted L shape are integrated with each other and whose cross-sectional shape is a T shape are connected thereto. It is noted that in the same manufacturing process, the electronic components 2 may be mounted onto the collective substrate 100 and the terminal connection substrates 3 may be connected thereto, or the electronic components 2 may be mounted onto the collective substrate 100, and the terminal connection substrates 3 may be connected thereto in another manufacturing process.

Here, a method for producing the collective substrate 100 using an LTCC substrate will be described. First, a ceramic slurry is coated on a PET film and then dried to produce a ceramic green sheet preferably having a thickness of about 10 μm to about 200 μm, for example. Via holes preferably having a diameter of about 0.1 mm are formed in the produced ceramic green sheet from the PET film side using a mold, a laser, or other suitable method, for example. Next, an electrode paste obtained by kneading a resin, an organic solvent, and a metal powder including silver or copper, for example, as a principal component is filled into the via holes and dried. Then, screen printing or other suitable method of the same electrode paste is conducted on the ceramic green sheet in a desired pattern, and the electrode paste is dried.

In this state, a plurality of ceramic green sheets are stacked and pressure-bonded to each other preferably under a pressure of about 100 kg/cm² to about 1500 kg/cm² and at a temperature of about 40° C. to about 100° C., for example. Then, the ceramic green sheets are sintered at about 850° C. in air if the electrode paste includes silver as a principal component, or are sintered at about 950° C. in nitrogen atmosphere if the electrode paste contains copper as a principal component, and a film of Ni/Sn, Ni/Au, Ni/Pd/Au, or other suitable material, for example, is formed on the electrodes by wet plating or other suitable method, to produce the collective substrate 100.

Each terminal connection substrate 3 is connected to the one surface of the collective substrate 100 so as to be located over a cut-out position of two adjacent base substrates 1. Each terminal connection substrate 3 is arranged and connected such that the position of the side surface thereof in the outward direction of the base substrate 1 coincides or substantially coincides with the position of the side surface of each base substrate 1. In addition, the electronic components 2 can be mounted on not only the one surface of the collective substrate 100 but also another surface thereof.

Figure 6B:
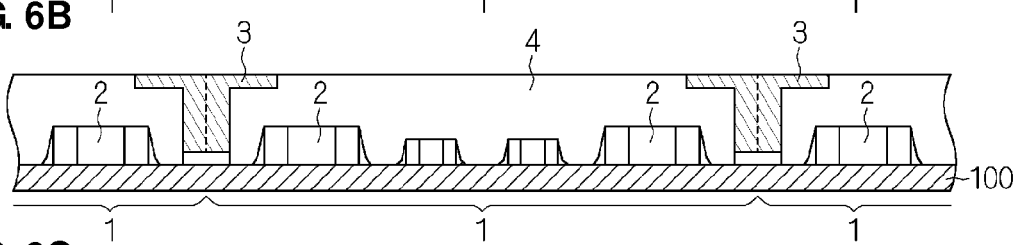
Figure 6C:
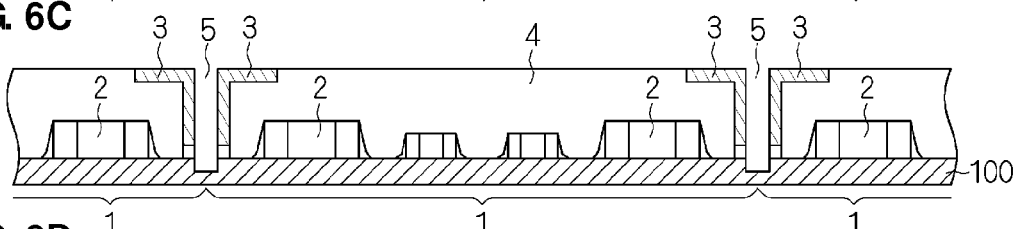

Next, as shown in FIG. 6B, a resin layer 4 is formed so as to cover the electronic components 2 mounted on surfaces of a plurality of the base substrates 1 (the collective substrate 100). The top surface of the resin layer 4 is ground such that portions of the terminal connection substrates 3 are exposed therefrom. Next, as shown in FIG. 6C, by using a dicer, grooves 5 are formed so as to extend from the top surfaces of the terminal connection substrates 3 to the base substrates 1 (the collective substrate 100). As a result of forming the grooves 5, each columnar terminal connection substrate 3 whose cross-sectional shape is a T shape is divided into two columnar terminal connection substrates 3 whose cross-sectional shape is an inverted L shape. It is noted that even when the grooves 5 are formed, portions or the entireties of the two adjacent base substrates 1 (collective substrate 100) are connected to each other.

Figure 6D:
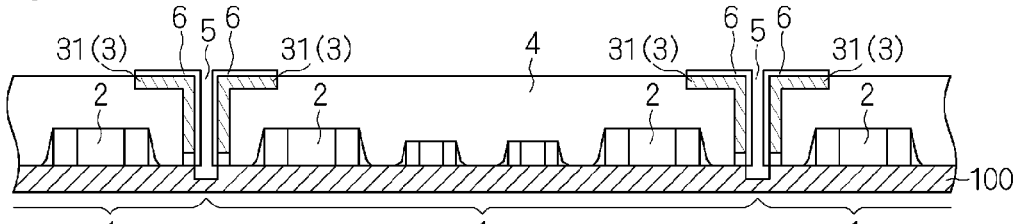

Next, as shown in FIG. 6D, a film of Ni/Sn, Ni/Au, Ni/Pd/Au, or other suitable material, for example, is formed by wet plating or other suitable method, for example, on the conductor portions 31 of the terminal connection substrates 3 exposed from the resin layer 4, to form plating layers 6. It is noted that since the portions or the entireties of the two adjacent base substrates 1 are connected to each other, the plating layers 6 can be formed at one time, and the operation can be efficiently performed as compared to a case in which a plurality of module substrates 10 are cut out from the collective substrate 100 and then plating layers 6 are individually formed on the respective module substrates 10.

Figure 6E:
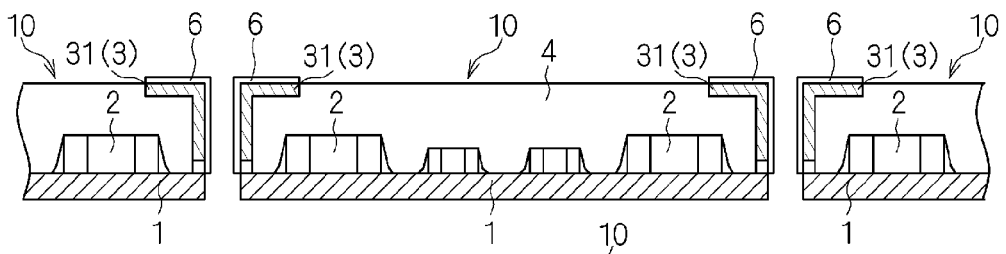
Figure 6F:
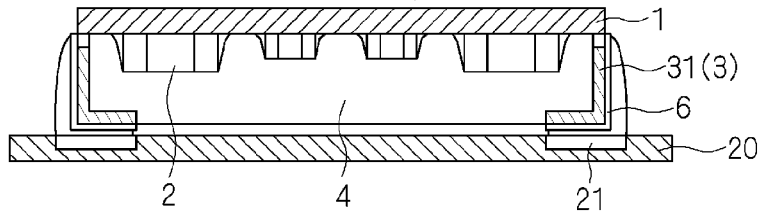
Figure 7A:
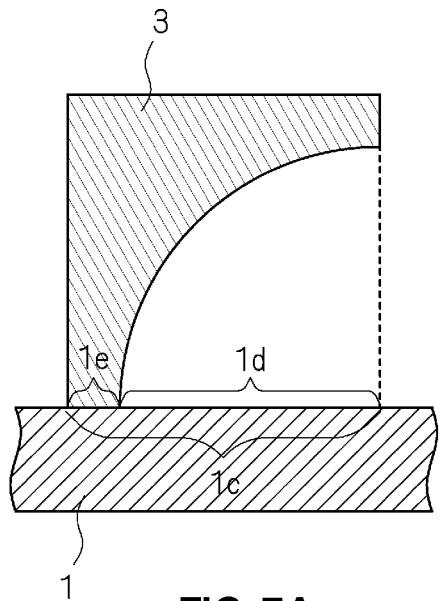
FIGS. 7A to 7D are schematic diagrams showing a cross-sectional shape of the terminal connection substrate according to the first preferred embodiment of the present invention.
Figure 7B:
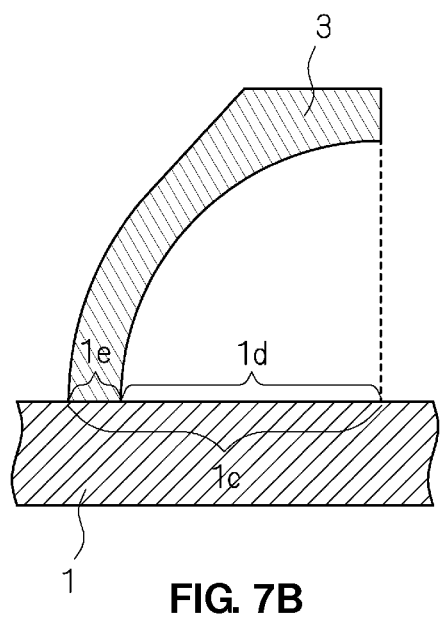
Figure 7C:
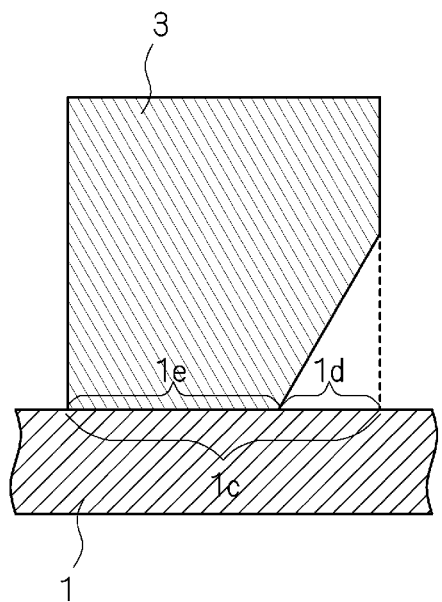
Figure 7D:
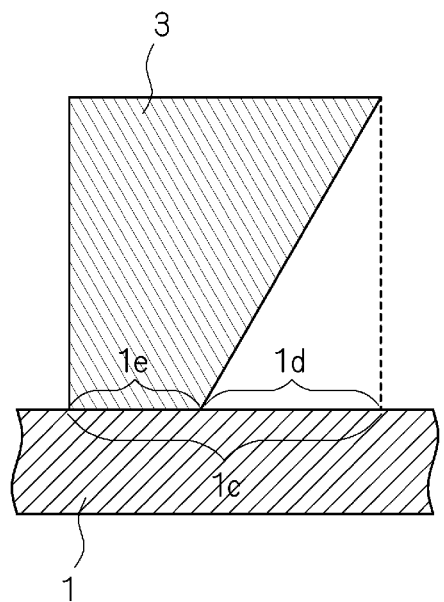

Next, as shown in FIG. 6E, by using a dicer, the collective substrate 100 is divided to cut out a plurality of module substrates 10. Next, as shown in FIG. 6F, each cut-out module substrates 10 is mounted onto a mounting substrate 20. The conductor portions 31 of the terminal connection substrates 3 on which the plating layers 6 are formed are connected to surface electrodes 21 on the mounting substrate 20 on which solder is printed, thereby mounting the cut-out module substrate 10 on the mounting substrate 20. In other words, each terminal connection substrate 3 is connected to the mounting substrate 20 at a surface thereof opposite to a surface connected to the base substrate 1, and thus, a space in which electronic components 2 can be mounted is provided between the base substrate 1 and the mounting substrate 20.

As described above, according to the first preferred embodiment of the present invention, at least one corner of each terminal connection substrate 3 is chamfered with a flat surface and/or curved surface, and each terminal connection substrate 3 is connected at a side surface contacting the chamfered flat surface and/or curved surface, to the one surface of the base substrate 1 on which a plurality of the electronic components 2 are mounted. Thus, it is possible to mount an electronic component 2 below the terminal connection substrate 3. Therefore, the size of a region in which electronic components 2 can be mounted is increased, and the number of mountable electronic components 2 is increased. In addition, it is possible to reduce the size of the module substrate 10 even when a required number of electronic components 2 are mounted thereon. In particular, since the cross-sectional shape of the terminal connection substrate 3 shown in FIG. 1 is an inverted L shape, the recess 3c surrounded by the terminal connection substrate 3 and the one surface of the base substrate 1 is provided, and a region in which electronic components 2 can be mounted includes the recess 3c.

It is noted that the cross-sectional shape of the terminal connection substrate 3 is not limited to an inverted L shape, and any shape in which at least one corner of the terminal connection substrate 3 is chamfered with a flat surface and/or curved surface and a region in which the terminal connection substrate 3 and the electronic component 2 overlap each other is provided when the one surface of the base substrate 1 is seen in a plan view from a direction perpendicular to the one surface of the base substrate 1 may be used.

FIGS. 7A to 7D are schematic diagrams showing cross-sectional shapes of the terminal connection substrate 3 according to first preferred embodiment of the present invention. The cross-sectional shape of the terminal connection substrate 3 shown in FIG. 7A preferably is an inverted L shape in which one corner is chamfered with a curved surface. The cross-sectional shape of the terminal connection substrate 3 shown in FIG. 7B preferably is a circular or substantially circular arc shape in which two opposing corners are chamfered with curved surfaces. In this case, a portion of the terminal connection substrate 3 which is connected to the mounting substrate 20 is preferably flat. The cross-sectional shape of the terminal connection substrate 3 shown in FIG. 7C preferably is a pentangular or substantially pentangular shape in which one corner is chamfered with a flat surface. The cross-sectional shape of the terminal connection substrate 3 shown in FIG. 7D preferably is a trapezoidal or substantially trapezoidal shape in which one corner is chamfered with a flat surface. With any of these shapes, when the one surface of the base substrate 1 is seen in a plan view from a direction perpendicular to the one surface of the base substrate 1, a region is provided in which the terminal connection substrate 3 and the electronic component 2 overlap each other. In other words, a region 1d is provided in which an electronic component 2 can be mounted below the terminal connection substrate 3. It is noted that the shape of the terminal connection substrate 3 is not limited to any of the shapes shown in FIGS. 7A to 7D, as long as it is a shape in which the area of the surface of the terminal connection substrate 3 connected to the mounting substrate 20 (the surface area of the region 1c) is greater than the area of the surface of the terminal connection substrate 3 connected to the base substrate 1 (the surface area of a region 1e) and the terminal connection substrate 3 can be located and connected such that the position of the side surface thereof in the outward direction of the base substrate 1 coincides or substantially coincides with the position of the side surface of the base substrate 1.

Furthermore, each terminal connection substrate 3 is not limited to being connected to the one surface of the collective substrates 100 before cutting out the base substrate 1 as shown in FIGS. 6A to 6F, and may be connected to the one surface of the base substrate 1 that has been cut out from the collective substrate 100.

Second Preferred Embodiment

Figure 8:
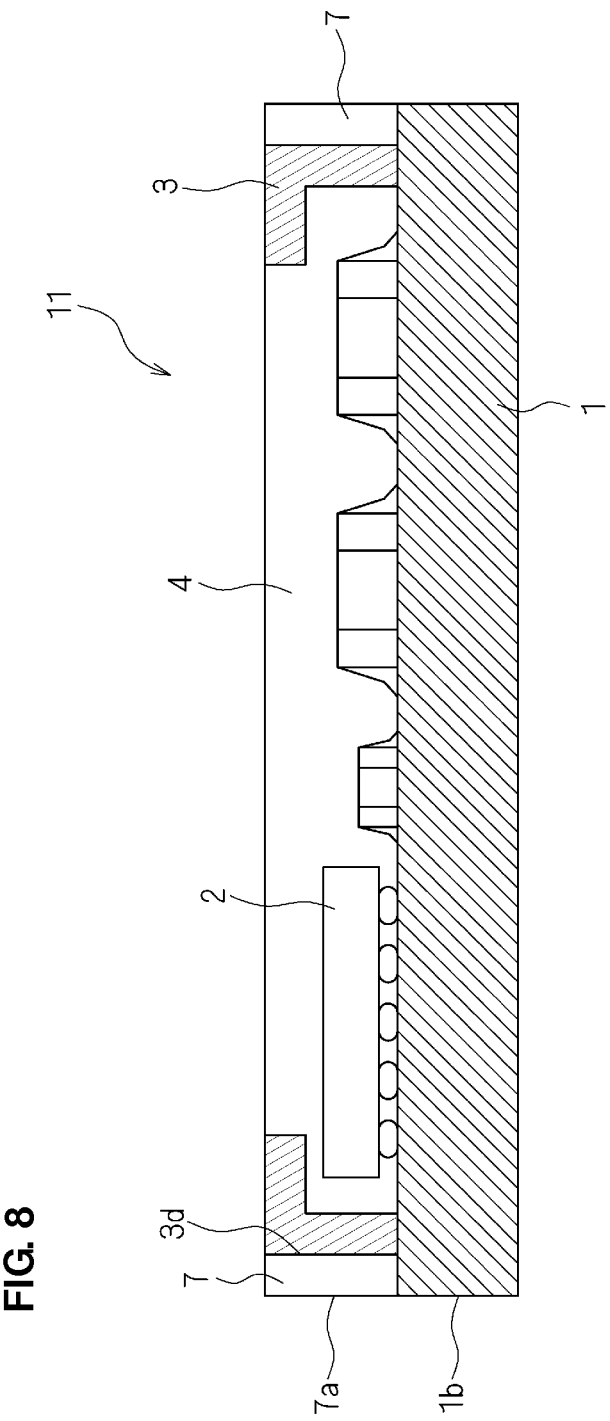
FIG. 8 is a schematic diagram showing a configuration of a module substrate according to a second preferred embodiment of the present invention.

In a module substrate according to a second preferred embodiment of the present invention, an insulating plate is disposed on a side surface, in an outward direction of a base substrate 1 of a terminal connection substrate 3 connected to one surface of the base substrate 1. FIG. 8 is a schematic diagram showing a configuration of the module substrate according to the second preferred embodiment of the present invention. As shown in FIG. 8, in the module substrate 11, an insulating plate 7 is disposed on a side surface 3d in the outward direction of the base substrate 1 of each terminal connection substrate 3 connected to the one surface of the base substrate 1. It is noted that the module substrate 11 has the same or substantially the same configuration as that of the module substrate 10 shown in FIG. 1, except that the insulating plate 7 is provided, and thus, the same elements are designated at the same reference signs and the detailed description thereof is omitted.

Figure 9:
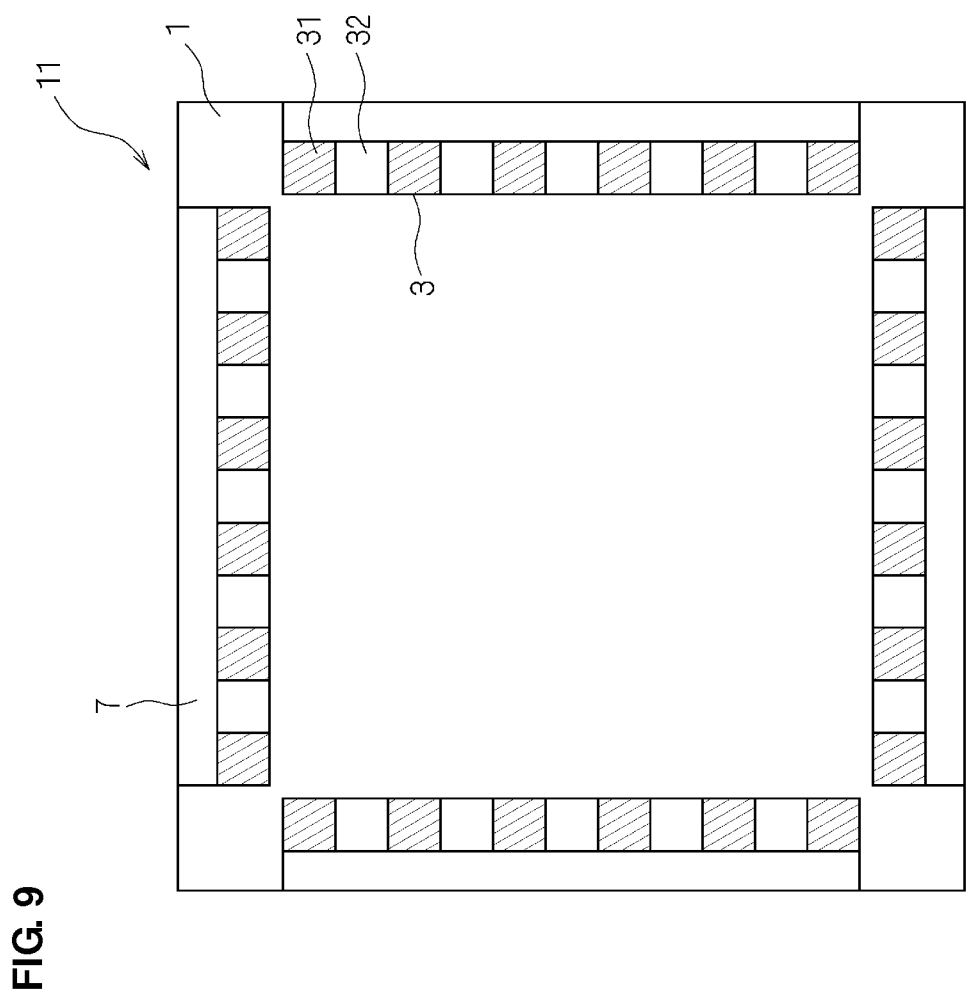
FIG. 9 is a plan view of the module substrate showing an arrangement of terminal connection substrates according to the second preferred embodiment of the present invention.

FIG. 9 is a plan view of the module substrate 11 showing an arrangement of terminal connection substrates 3 according to the second preferred embodiment of the present invention. As shown in FIG. 9, the terminal connection substrates 3 are connected to edge portions, respectively, of the rectangular base substrate 1. The insulating plate 7 is disposed on the side surface in the outward direction of the base substrate 1 of each connected terminal connection substrate 3. As shown in FIG. 8, the insulating plate 7 is disposed such that the position of a side surface 7a thereof in the outward direction of the base substrate 1 coincides or substantially coincides with the side surface 1b of the base substrate 1, and thus, the size of a region in which electronic components 2 can be mounted is increased while the size of the module substrate 11 is reduced. It is noted that the insulating plate 7 may not be disposed on the entire side surface in the outward direction of the base substrate 1 of each terminal connection substrate 3.

Figure 10:
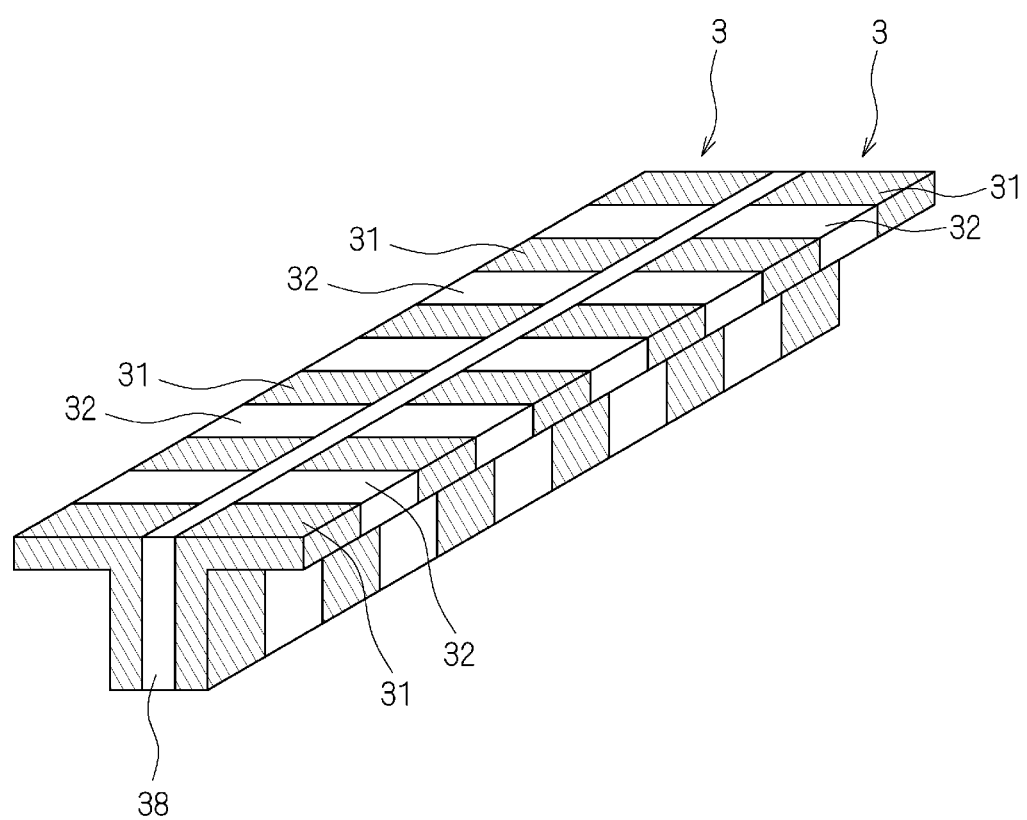
FIG. 10 is a perspective view showing a configuration of a terminal connection substrate according to the second preferred embodiment of the present invention.

FIG. 10 is a perspective view showing a configuration of the terminal connection substrate 3 according to the second preferred embodiment of the present invention. As shown in FIG. 10, a columnar terminal connection substrate 3 is provided in which two columnar terminal connection substrates 3 whose cross-sectional shape is an inverted L shape are connected to each other via an insulating material (support portion) 38 and whose cross-sectional shape is a T shape. In the terminal connection substrate 3, a plurality of conductor portions 31 are fixed to each other via insulating portions 32 and the insulating material (support portion) 38. The terminal connection substrate 3 is formed by alternately stacking the conductor portions 31 and the insulating portions 32 in a column on both side surfaces of the insulating material (support portion) 38. In addition, a method for manufacturing the columnar terminal connection substrate 3 whose cross-sectional shape is a T shape is the same or substantially the same as the manufacturing method shown in FIGS. 4A to 4E, and thus, the detailed description thereof is omitted.

Figure 11A:
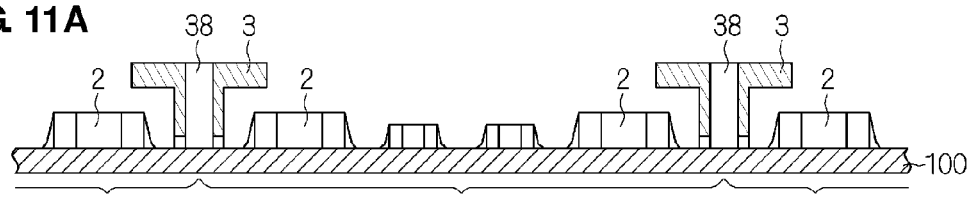
FIGS. 11A to 11F are schematic diagrams showing a process for manufacturing the module substrate according to the second preferred embodiment of the present invention.

A method for manufacturing a module substrate 11 by connecting, to a collective substrate 100, columnar terminal connection substrates 3 whose cross-sectional shape is a T shape will be described. FIGS. 11A to 11F is a schematic diagram showing a process for manufacturing the module substrate 11 according to the second preferred embodiment of the present invention. First, as shown in FIG. 11A, on one surface of the collective substrate 100, electronic components 2 are mounted on surface electrodes (not shown) on which solder is printed, and columnar terminal connection substrates 3 in which two columnar terminal connection substrates 3 whose cross-sectional shape is an inverted L shape are connected to each other via an insulating material (support portion) 38 and whose cross-sectional shape is a T shape is connected thereto. It is noted that in the same manufacturing process, the electronic components 2 may be mounted on the collective substrate 100 and the terminal connection substrates 3 may be connected thereto, or the electronic components 2 may be mounted on the collective substrate 100 and the terminal connection substrates 3 may be connected thereto in another manufacturing process.

Each terminal connection substrate 3 is connected to the one surface of the collective substrate 100 such that the insulating material 38 is arranged over a cut-out position of two adjacent base substrates 1. The electronic components 2 can be mounted on not only the one surface of the collective substrate 100 but also another surface thereof.

Figure 11B:
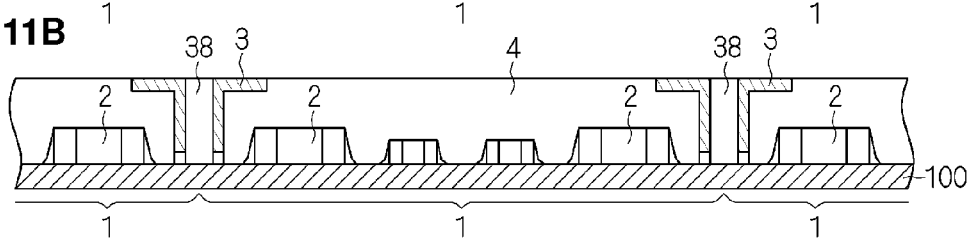
Figure 11C:
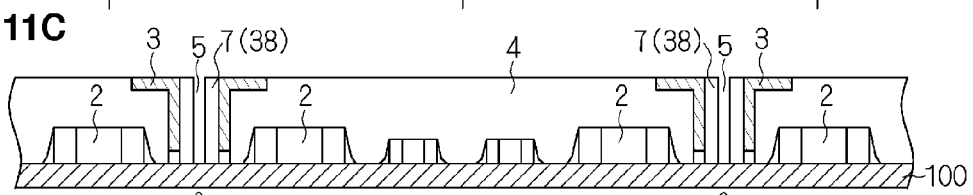

Next, as shown in FIG. 11B, a resin layer 4 is formed so as to cover the electronic components 2 mounted on surfaces of a plurality of base substrates 1 (the collective substrate 100). The top surface of the resin layer 4 is ground such that portions of the terminal connection substrates 3 are exposed therefrom. Next, as shown in FIG. 11C, by using a dicer, grooves 5 are formed so as to extend from the top surfaces of the terminal connection substrates 3 to the base substrates 1 (the collective substrate 100). As a result of forming the grooves 5, each insulating material 38 is divided into two columnar terminal connection substrates 3 whose cross-sectional shape is an inverted L shape. The width (width in a direction in which the terminal connection substrates 3 sandwich the insulating material 38) of each groove 5 is less than the width (width in the direction in which the terminal connection substrates 3 sandwich the insulating material 38) of the insulating material 38, and thus, the divided insulating material 38 remains on the side surface, in the outward direction of the base substrate 1, of each terminal connection substrate 3 and is formed as an insulating plate 7. It is noted that even when the grooves 5 are formed, portions or the entireties of the two adjacent base substrates 1 (the collective substrate 100) are connected to each other.

Figure 11D:
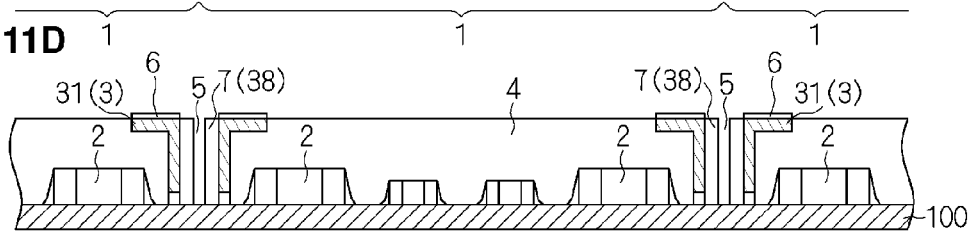

Next, as shown in FIG. 11D, a film of Ni/Sn, Ni/Au, Ni/Pd/Au, or other suitable material, for example, is formed by wet plating or other suitable method, for example, on the conductor portions 31 of the terminal connection substrates 3 exposed from the resin layer 4, to form plating layers 6. It is noted that since the portions or the entireties of the two adjacent base substrates 1 are connected to each other, the plating layers 6 can be formed at one time, and the operation can be efficiently performed as compared to the case in which a plurality of module substrates 11 are cut from the collective substrate 100 and then plating layers 6 are individually formed on the respective module substrates 11.

Figure 11E:
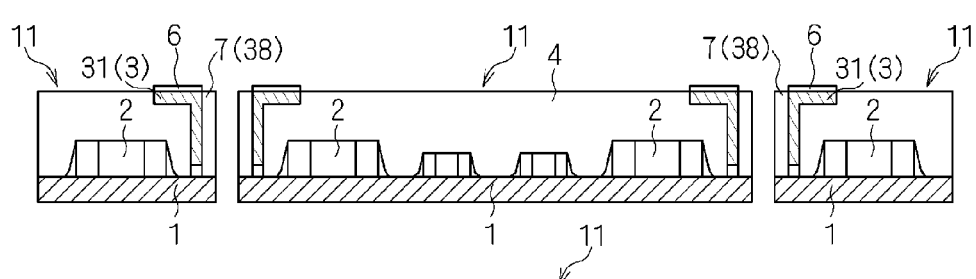
Figure 11F:
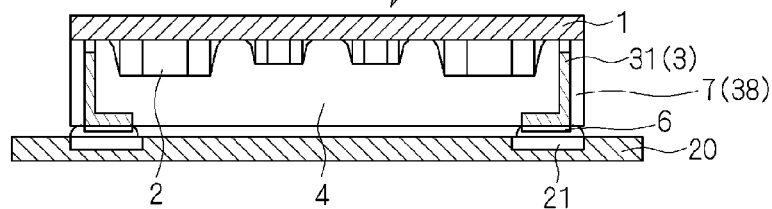

Next, as shown in FIG. 11E, by using a dicer, the collective substrate 100 is divided to cut out a plurality of module substrates 11. Next, as shown in FIG. 11F, each cut-out module substrate 11 is mounted on a mounting substrate 20. The conductor portions 31 of the terminal connection substrates 3 on which the plating layers 6 are formed are connected to surface electrodes 21 on the mounting substrate 20 on which solder is printed, thereby mounting the cut-out module substrate 11 on the mounting substrate 20.

As described above, according to the second preferred embodiment of the present invention, the terminal connection substrates 3 in which the two columnar terminal connection substrates 3 whose cross-sectional shape is an inverted L shape are connected to each other via the insulating material (support portion) 38 and whose cross-sectional shape is a T shape are formed, each columnar terminal connection substrate 3 is connected to the one surface of the collective substrate 100 such that the insulating material (support portion) 38 is arranged over the cut-out position, and a plurality of the module substrates 11 are cut from the collective substrate 100 at the cut-out position. When a plurality of the module substrates 11 are cut from the collective substrate 100, the insulating material (support portion) 38 is divided into the two columnar terminal connection substrates 3 whose cross-sectional shape is an inverted L shape. Thus, a recess surrounded by each terminal connection substrate 3 and the one surface of the base substrate 1 is formed, and a region in which electronic components 2 can be mounted includes the recess. Therefore, the number of mountable electronic components 2 is increased, and it is possible to reduce the size of the module substrate 11 even when a required number of electronic components 2 are mounted thereon. In addition, the insulating material (support portion) 38 protects the side surface in the outward direction of the base substrate 1, of the terminal connection substrate 3, and prevents oxidation of the conductor portions 31 of the terminal connection substrate 3. Furthermore, even when the insulating material (support portion) 38 is formed from an insulating material, it is possible to provide a shield film on the side surface, in the outward direction of the base substrate 1, of the terminal connection substrate 3.

It is noted that each terminal connection substrate 3 is not limited to being connected to the one surface of the collective substrate 100 before cutting out the base substrates 1 as shown in FIG. 11, and may be connected to the one surface of the base substrate 1 that has been cut out from the collective substrate 100.

Third Preferred Embodiment

Figure 12:
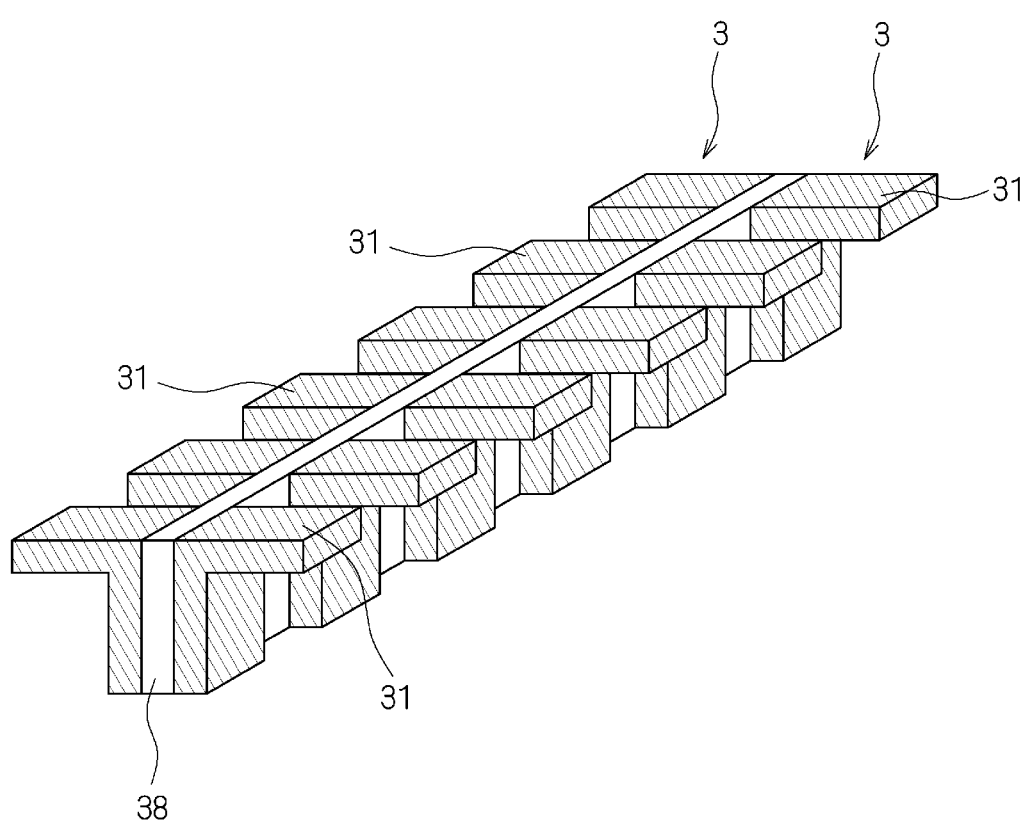
FIG. 12 is a perspective view showing a configuration of a terminal connection substrate according to a third preferred embodiment of the present invention.

In a module substrate according to a third preferred embodiment of the present invention, an insulating plate 7 is disposed on a side surface, in an outward direction of a base substrate 1, of a terminal connection substrate 3 connected to one surface of the base substrate 1 similarly to the second preferred embodiment, but the terminal connection substrate 3 does not include an insulating portion. FIG. 12 is a perspective view showing the configuration of the terminal connection substrate 3 according to the third preferred embodiment of the present invention. As shown in FIG. 12, two columnar terminal connection substrates 3 in which a plurality of conductor portions 31 are fixed to each other via an insulating material (support portion) 38 and whose cross-sectional shape is an inverted L shape are provided as one terminal connection substrate 3. In other words, the columnar terminal connection substrate 3 is provided in which the two columnar terminal connection substrates 3 whose cross-sectional shape is an inverted L shape are connected to each other via the insulating material 38 and whose cross-sectional shape is a T shape. It is noted that the terminal connection substrate 3 is configured such that a plurality of the conductor portions 31 are arranged at predetermined intervals and no insulating portion is provided between each conductor portion 31. In addition, a method for manufacturing the columnar terminal connection substrate 3 whose cross-sectional shape is a T shape is the same or substantially the same as the manufacturing method shown in FIG. 4A to 4E, and thus, the detailed description thereof is omitted. Moreover, the module substrate according the third preferred embodiment of the present invention has the same or substantially the same configuration as that of the module substrate 11 shown in FIG. 8, and thus, the detailed description thereof is omitted.

Figure 13:
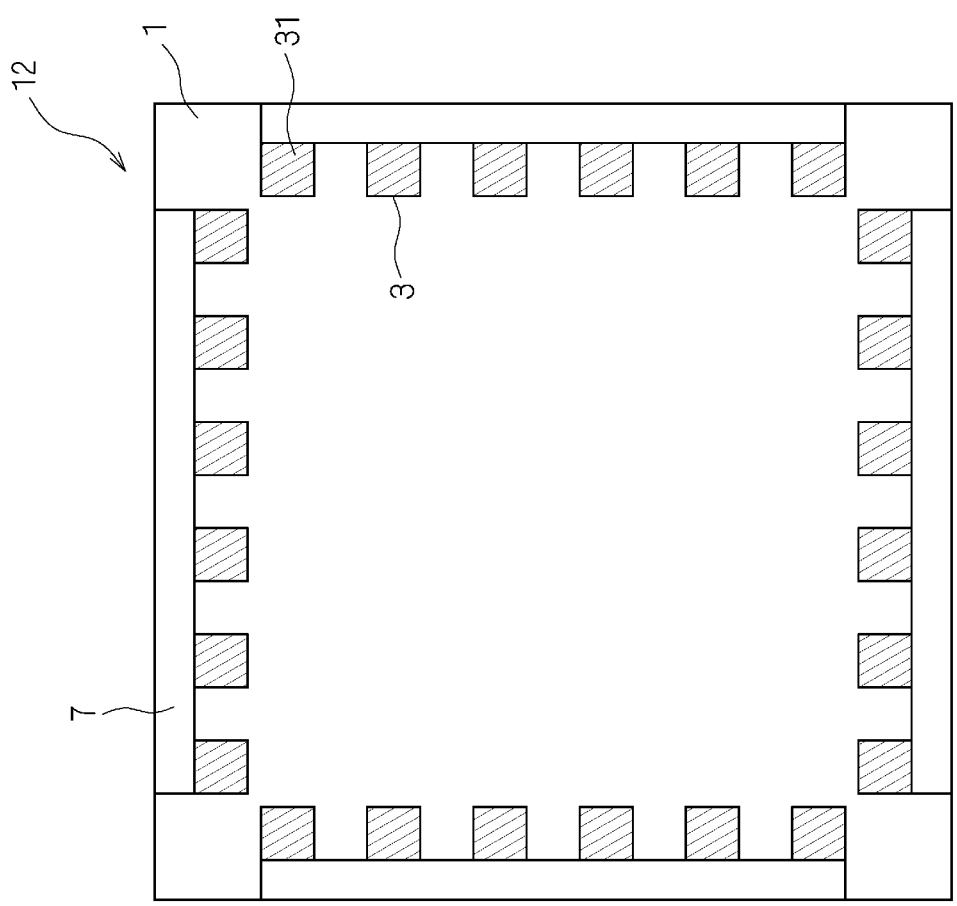
FIG. 13 is a plan view of a module substrate showing an arrangement of terminal connection substrates according to the third preferred embodiment of the present invention.

FIG. 13 is a plan view of the module substrate showing an arrangement of terminal connection substrates 3 according to the third preferred embodiment of the present invention. As shown in FIG. 13, the terminal connection substrates 3 are connected to edge portions, respectively, of a rectangular base substrate 1. The insulating plate 7 is disposed on the side surface, in the outward direction of the base substrate 1, of each connected terminal connection substrate 3. In the module substrate 12 according to the third preferred embodiment of the present invention, the columnar terminal connection substrates 3 in which a plurality of the conductor portions 31 are arranged at predetermined intervals and no insulating portion is provided between each conductor portion 31 are connected to one surface of the base substrate 1 on which a plurality of electronic components 2 are mounted. It is noted that a method for manufacturing the module substrate 12 preferably is the same or substantially the same as the manufacturing method shown in FIG. 11, and thus, the detailed description thereof is omitted.

As described above, according to the third preferred embodiment of the present invention, with regard to the terminal connection substrates 3 in which a plurality of the conductor portions 31 are arranged at predetermined intervals and no insulating portion is provided between each conductor portion 31, the two columnar terminal connection substrates 3 in which a plurality of conductor portions 31 are fixed to the insulating material 38 (insulating plate 7) and whose cross-sectional shape is an inverted L shape are connected as a single terminal connection substrate 3. Thus, a plurality of the conductor portions 31 can be connected as the single terminal connection substrate 3 to the one surface of the base substrate 1 on which a plurality of the electronic components 2 are mounted, and an operation for manufacturing the module substrate 12 is simplified.

Figure 14:
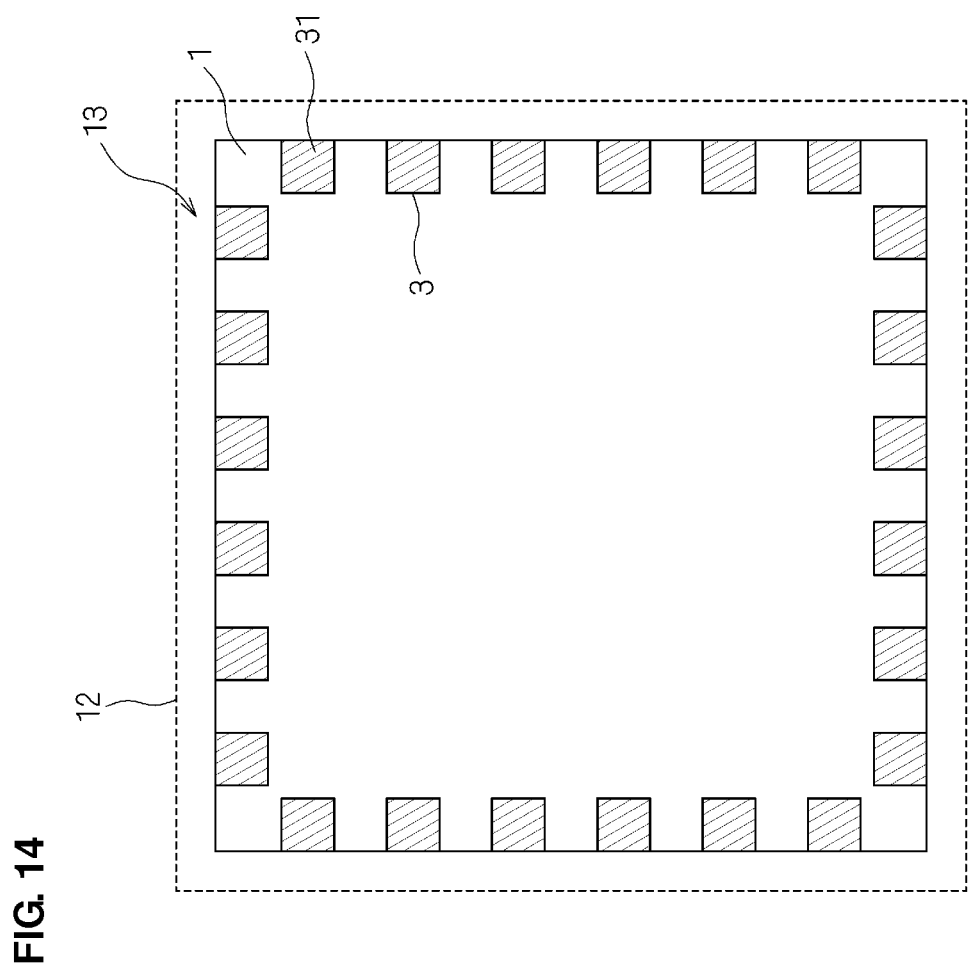
FIG. 14 is a plan view of the module substrate showing another arrangement of the terminal connection substrates according to the third preferred embodiment of the present invention.

It is noted that after the terminal connection substrate 3 in which a plurality of the conductor portions 31 are fixed to the insulating material 38 is connected to the one surface of the base substrate 1, the insulating material 38 may be removed. Specifically, when the width of each groove 5 provided in FIG. 11C is greater than the width of the insulating material 38, the insulating material 38 of the insulating plate 7 is chipped off to provide the groove 5, thereby removing the insulating material 38 of the insulating plate 7 on the side surface, in the outward direction of the base substrate 1, of the terminal connection substrate 3. FIG. 14 is a plan view of the module substrate showing another arrangement of the terminal connection substrates 3 according to the third preferred embodiment of the present invention. As shown in FIG. 14, when the insulating plates 7 (insulating materials 38) are removed, the size of the module substrate 13 can be reduced by removing the insulating materials 38 (the difference between the outer shape of the module substrate 12 indicated by a broken line and the outer shape of the module substrate 13). It is noted that all of the insulating materials 38 may not be removed, and the insulating plate 7 may partially remain.

Fourth Preferred Embodiment

Figure 15:
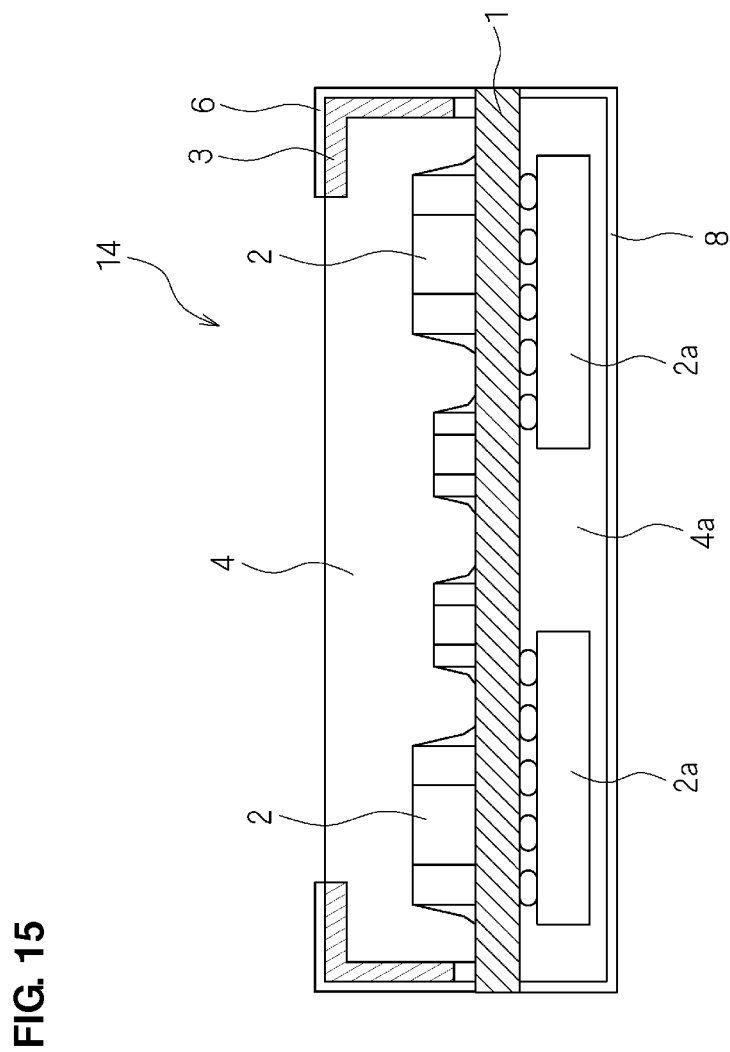
FIG. 15 is a schematic diagram showing a configuration of a module substrate according to a fourth preferred embodiment of the present invention.

In a module substrate according to a fourth preferred embodiment of the present invention, electronic components are mounted on both surfaces of a base substrate 1. FIG. 15 is a schematic diagram showing a configuration of the module substrate according to the fourth preferred embodiment of the present invention. As shown in FIG. 15, in the module substrate 14, electronic components 2 and 2a are mounted on both surfaces of a base substrate 1. It is noted that the module substrate 14 preferably has substantially the same configuration as that of the module substrate 10 shown in FIG. 1, except that the electronic components 2 and 2a are mounted on both surfaces of the base substrate 1, and thus, the same elements are designated by the same reference signs and the detailed description thereof is omitted.

Figure 16A:
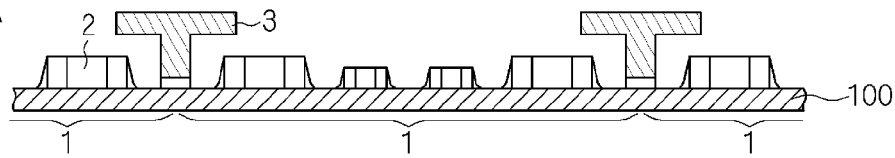
FIGS. 16A to 16H are schematic diagrams showing a process for manufacturing the module substrate according to the fourth preferred embodiment of the present invention.

FIGS. 16A to 16H are schematic diagrams showing a process for manufacturing the module substrate 14 according to the fourth preferred embodiment of the present invention. First, as shown in FIG. 16A, on one surface of a collective substrate 100, electronic components 2 are mounted onto surface electrodes (not shown) on which solder is printed, and columnar terminal connection substrates 3 whose cross-sectional shape is a T shape are connected thereto. It is noted that in the same manufacturing process, the electronic components 2 may be mounted onto the collective substrate 100 and the terminal connection substrates 3 may be connected thereto, or the electronic components 2 may be mounted on the collective substrate 100, and the terminal connection substrates 3 may be connected thereto in another manufacturing process.

Each terminal connection substrate 3 is connected to the one surface of the collective substrate 100 so as to be arranged over a cut-out position of two adjacent base substrates 1. Each terminal connection substrate 3 is connected such that the position of the side surface thereof in the outward direction of the base substrate 1 coincides or substantially coincides with the position of the side surface of the base substrate 1.

Figure 16B:
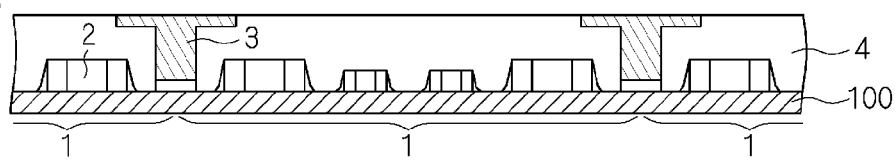
Figure 16C:
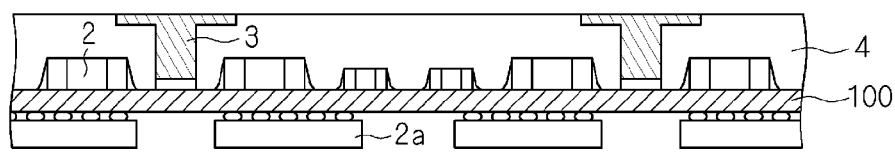
Figure 16D:
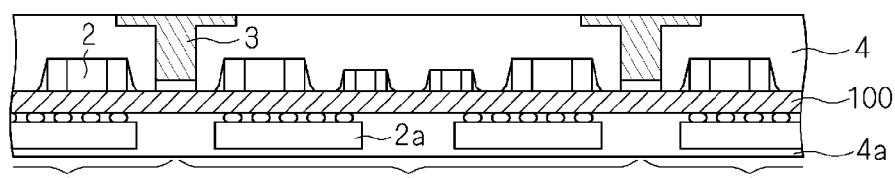

Next, as shown in FIG. 16B, a resin layer 4 is formed so as to cover the electronic components 2 mounted on surfaces of a plurality of base substrates 1 (the collective substrate 100). The top surface of the resin layer 4 is ground such that portions of the terminal connection substrates 3 are exposed therefrom. Next, as shown in FIG. 16C, on the surface of the collective substrate 100 opposite to the one surface on which the electronic components 2 are mounted in FIG. 16A, electronic components 2a are mounted onto surface electrodes (not shown) on which solder is printed. Next, as shown in FIG. 16D, a resin layer 4a is formed so as to cover the electronic components 2a mounted on the surface of the base substrate 1.

Figure 16E:
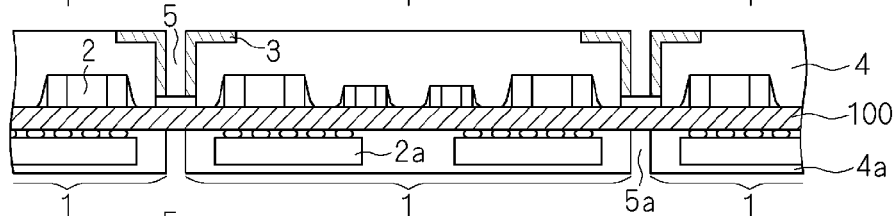

Next, as shown in FIG. 16E, by using a dicer, grooves 5 are formed so as to extend from the top surfaces of the terminal connection substrates 3 to the base substrates 1, and grooves 5a are formed so as to extend from the top surface of the resin layer 4a to the base substrates 1. As a result of forming the grooves 5, each columnar terminal connection substrate 3 whose cross-sectional shape is a T shape is divided into two columnar terminal connection substrates 3 whose cross-sectional shape is an inverted L shape. The grooves 5a are formed at the corresponding positions on the surfaces of the base substrates 1 opposite to the surfaces thereof in which the grooves 5 are formed. It is noted that even when the grooves 5 and 5a are formed, portions or the entireties of the two adjacent base substrates 1 are connected to each other.

Figure 16F:
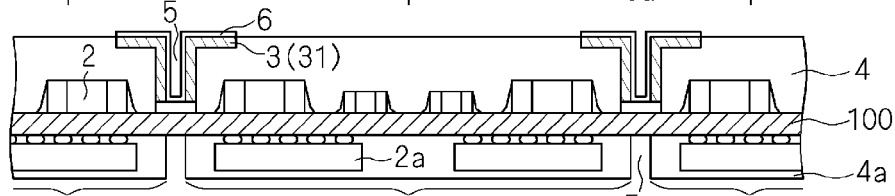

Next, as shown in FIG. 16F, a film of Ni/Sn, Ni/Au, Ni/Pd/Au, or other suitable material, for example, is formed by wet plating or other suitable method, for example, on the conductor portions 31 of each terminal connection substrate 3 exposed from the resin layer 4, thereby forming plating layers 6. It is noted that since the portions or the entireties of the two adjacent base substrates 1 are connected to each other, the plating layers 6 can be formed at one time, and the operation can be efficiently performed as compared to the case in which a plurality of module substrates 14 are cut out from the collective substrate 100 and then plating layers 6 are formed in the respective module substrate 14.

Figure 16G:
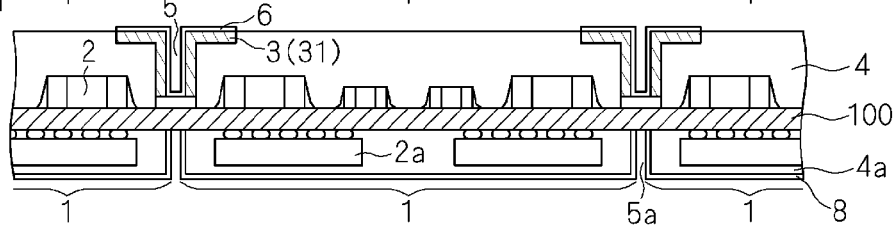
Figure 16H:
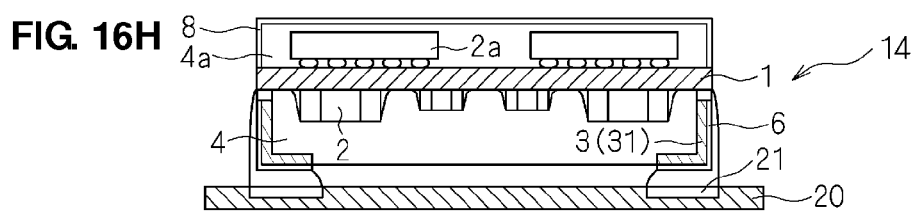

Next, as shown in FIG. 16G, a shield layer 8 is formed from a conductive material on the top surface of the resin layer 4a and side surfaces of the resin layer 4a which are formed by the grooves 5a. Next, as shown in FIG. 16H, by using a dicer, the collective substrate 100 is divided to cut out a plurality of module substrates 14, and each cut-out module substrate 14 is mounted onto a mounting substrate 20. The conductor portions 31 of the terminal connection substrates 3 on which the plating layer 6 is formed are connected to a surface electrodes 21 on the mounting substrate 20 on which solder is printed, thereby mounting the cut-out module substrate 14 on the mounting substrate 20.

As described above, according to the fourth preferred embodiment of the present invention, the electronic components 2 and 2a are mounted on both surfaces of the base substrate 1. Thus, the number of mountable electronic components 2 and 2a is increased, and it is possible to reduce the size of the module substrate 14 even when a required number of electronic components 2 and 2a are mounted thereon.

It is noted that as shown in FIGS. 16A to 16H, each terminal connection substrate 3 is not limited to being connected to the one surface of the collective substrate 100 before cutting out the base substrates 1, and may be connected to the one surface of the base substrate 1 that has been cut out from the collective substrate 100. In the first to fourth preferred embodiments, the methods for manufacturing the module substrates 10 to 14 including the columnar terminal connection substrates 3 having a plurality of the conductor portions 31 have been described. However, a plurality of conductor portions 31 may be individually prepared and may be connected to a base substrate 1.

Figure 17:
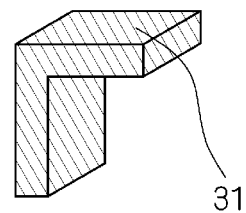
FIG. 17 is a perspective view showing a configuration of a conductor portion according to another preferred embodiment of the present invention.
Figure 18:
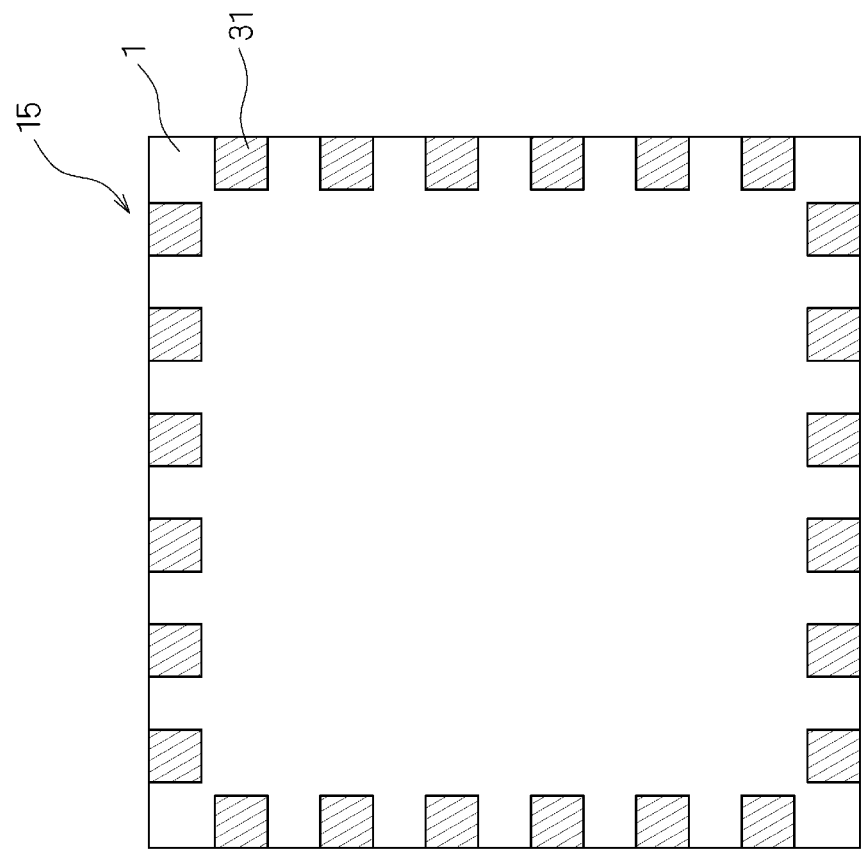
FIG. 18 is a plan view of a module substrate showing an arrangement of conductor portions according to another preferred embodiment of the present invention.

FIG. 17 is a perspective view showing a configuration of a conductor portion 31 according to another preferred embodiment of the present invention. A plurality of conductor portions 31 whose cross-sectional shape is an inverted L shape as shown in FIG. 17 are individually provided. FIG. 18 is a plan view of a module substrate showing an arrangement of the conductor portions 31 according to the another preferred embodiment of the present invention. As shown in FIG. 18, in the module substrate 15, the conductor portions 31 are arranged at each edge portion of a rectangular base substrate 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module substrate comprising:
    a base substrate;
    a plurality of surface-mount electronic components mounted on at least one surface of the base substrate;
    a plurality of conductor portions connected to the one surface of the base substrate on which the plurality of the surface-mount electronic components are mounted; wherein at least one corner of each of the plurality of conductor portions is chamfered with a curved surface;
    each of the plurality of conductor portions is connected, at a side surface thereof contacting the chamfered curved surface, to the one surface of the base substrate;
    an outermost side surface of each of the plurality of conductor portions in an outward direction of the base substrate is flush or substantially flush with a side surface of the base substrate in the outward direction of the base substrate;
    at least a portion of at least one of the plurality of surface-mount electronic components is boated under the at least one corner of at least one of the plurality of conductor portions that is chamfered with the curved surface; and
    a cross-sectional shape of each of the plurality of conductor portions in a plane perpendicular to the base substrate is an inverted L shape that is defined by the at least one corner that is chamfered; and
    a columnar terminal connection substrate including the plurality of the conductor of the surface-mount electronic components are mounted; wherein
    at least one corner of the terminal connection substrate is chamfered with the curved surface; and
    the terminal connection substrate is connected, at a side surface thereof contacting the chamfered curved surface to the one surface of the base substrate.

2. The module substrate according to claim 1, wherein each of the plurality of conductor portions is arranged such that the chamfered curved surface faces an inside of the base substrate.

3. The module substrate according to claim 1, wherein the terminal connection substrate is arranged such that the chamfered curved surface faces an inside of the base substrate.

4. The module substrate according to claim 1, wherein a cross-sectional shape of the terminal connection substrate is an inverted L shape.

5. The module substrate according to claim 1, wherein the terminal connection substrate includes a plurality of insulating portions; and the plurality of conductor portions and the insulating portions are alternately stacked in a column.

6. The module substrate according to claim 1, wherein an insulating plate is disposed on a side surface of the terminal connection substrate in an outward direction of the base substrate.

7. The module substrate according to claim 5, wherein the plurality of the conductor portions are fixed to each other via the insulating portions and/or the insulating plate in the terminal connection substrate.

8. The module substrate according to claim 1, wherein a region in which the plurality of conductor portions overlap the electronic component is provided when the one surface of the base substrate is viewed in a plan view from a direction perpendicular to the one surface of the base substrate.

9. The module substrate according to claim 1, further comprising:
    a resin layer covering the plurality of surface-mount electronic components mounted on the one surface of the base substrate; wherein
    a portion of each of the plurality of conductor portions or the terminal connection substrate is exposed from the resin layer.

10. The module substrate according to claim 1, wherein each conductor portion is connected to a mounting substrate at a surface thereof opposite to a surface thereof connected to the base substrate.

* * * * *